United States Patent
Deacon

(10) Patent No.: US 6,341,189 B1
(45) Date of Patent: Jan. 22, 2002

(54) LENTICULAR STRUCTURE FOR INTEGRATED WAVEGUIDES

(75) Inventor: David A. G. Deacon, Los Altos, CA (US)

(73) Assignee: Sparkolor Corporation, Santa Barbara, CA (US)

(*) Notice: Subject to any disclaimer, the term of this patent is extended or adjusted under 35 U.S.C. 154(b) by 0 days.

(21) Appl. No.: 09/438,887

(22) Filed: Nov. 12, 1999

(51) Int. Cl.⁷ .................................................. G02B 6/10
(52) U.S. Cl. ..................................................... 385/130
(58) Field of Search ................................. 385/12, 37, 2, 385/3, 130–135; 356/128, 328; 359/245, 279, 332, 328; 372/45

(56) References Cited

U.S. PATENT DOCUMENTS

| | | | |
|---|---|---|---|
| 3,935,472 A | * 1/1976 | Bethea et al. | 359/328 |
| 3,978,426 A | 8/1976 | Logan et al. | 331/94.5 |
| 4,093,345 A | * 6/1978 | Logan et al. | 359/245 |
| 4,415,227 A | 11/1983 | Unger | 350/96.15 |
| 4,773,720 A | 9/1988 | Hammer | 350/96.12 |
| 4,786,132 A | 11/1988 | Gordon | 350/96.19 |
| 4,795,228 A | 1/1989 | Schneider | 350/96.18 |
| 4,932,032 A | 6/1990 | Koch et al. | 372/45 |
| 4,943,133 A | * 7/1990 | Deri et al. | 385/3 |
| 5,042,898 A | 8/1991 | Morey et al. | 385/37 |
| 5,078,516 A | 1/1992 | Kapon et al. | 385/129 |
| 5,082,629 A | * 1/1992 | Burgess | 356/128 |
| 5,121,182 A | 6/1992 | Kuroda et al. | 357/30 |
| 5,199,092 A | 3/1993 | Stegmueller | 385/50 |
| 5,261,017 A | 11/1993 | Melman et al. | 385/38 |
| 5,278,926 A | 1/1994 | Doussiere | 385/28 |
| 5,323,476 A | 6/1994 | Mueller et al. | 385/43 |
| 5,574,742 A | 11/1996 | Ben-Michael et al. | 372/45 |
| 5,577,141 A | 11/1996 | Adair et al. | 385/43 |
| 5,703,989 A | 12/1997 | Khan et al. | 385/130 |
| 5,818,860 A | * 10/1998 | Garbuzov et al. | 372/45 |
| 5,844,929 A | 12/1998 | Lealman et al. | 372/45 |
| 5,870,417 A | 2/1999 | Verdiell et al. | 372/32 |

OTHER PUBLICATIONS

Mizuuchi et al., *High–Efficiency Coupling of Laser Diodes in Tapered Proton–Exchanged Waveguides*, Electronics Letters, Nov. 22, 1990, 1992–94, vol. 26. No. 24.

Shani et al., *Efficient Coupling of a Semiconductor Laser to an Optical Fiber by Means of a Tapered Waveguide on Silicon*, Dec. 4, 1989, 2389–91, 55(23).

Smith et al., *Reduced Coupling Loss Using a Tapered–Rib Adiabatic–Following Fiber Coupler*, IEEE Photonics Technology Letters, Aug. 1996, 1052–54, vol. 8, No. 8.

Suchoski et al., *Constant–Width Variable–Index Transition for Efficient Ti:LiNbO3 Waveguide–Fiber Coupling*, Journal of Lightwave Technology, Sep. 1987, 1246–51, vol. LT–5, No. 9.

(List continued on next page.)

Primary Examiner—Akm E. Ullah
(74) Attorney, Agent, or Firm—Scott Hewett

(57) ABSTRACT

The invention has multiple embodiments and applications including a digitally tunable laser source, a tapered waveguide, a lensed waveguide, and a tunable laser array. Also described are methods for making and tuning these devices. The laser source includes materials with negative index of refraction dependence on temperature and with temperature independent coincidence between resonator modes and a set of specified frequencies such as DWDM channels in telecommunications applications. The free spectral range may be adjusted to equal a rational fraction of the specified frequency interval. An advantageous embodiment of a tapered waveguide may be used to efficiently couple different size waveguides, such as in a resonator containing both a semiconductor diode amplifier waveguide and a planar waveguide structure for coupling to an optical fiber. An advantageous embodiment of a lensed planar waveguide may be used to efficiently couple to a different size waveguide such as a semiconductor diode amplifier waveguide.

43 Claims, 7 Drawing Sheets

OTHER PUBLICATIONS

Tohmori et al., *Spot–size Converted 1.3micron Laser with Butt–Jointed Selectively Grown Vertically Tapered Waveguide*, Electronics Letters, Jun. 22, 1995, 1069–70, vol. 31, No. 13.

Vawter et al., *Semiconductor Laser with Tapered–Rib Adiabatic–Following Fiber Coupler for Expanded Output–Mode Diameter*, IEEE Photonics Technology Letters, Apr. 1997, 425–27, vol. 9, No. 4.

Winn et al., *Coupling from Multimode to Single–Mode Linear Waveguides Using Horn–Shaped Structures*, IEEE Transactions on Microwave Theory and Techniques, Jan. 1975, 92–97, vol. MTT–23, No. 1.

Zengerle et al., *Waveguide Structure*, Electronics Letters, Mar. 26, 1992, 631–32, vol. 28, No. 7.

TADA et al., *Temperature Compensated Coupled Cavity Diode Lasers*, Optical and Quantum Electronics, 1984, 463–69, vol. 16.

Lin, Ching–Fuh, *Superluminescent Diodes with Bent Waveguide*, IEEE Photonics Technology Letters, Feb. 1996, 206–08, vol. 8, No. 2.

Morton et al., *Stable Single Mode Hybrid Lawer with High Power and Narrow Linewidth*, Appl. Phys. Lett., May 16, 1994, 2634–36, vol. 64, No. 20.

Gnazzo et al., *Improved Analysis and Design of Waveguide Bragg Grating Filters for Wavelength Division Multiplexing Applications*, Integrated Photonics Research Conference, Optical Society of America, 1996, 410–13.

Moshrefzdeh et al., *Temperature Dependence of Index of Refraction of Polymeric Waveguides*, Journal of Lightwave Technology, Apr. 1992, 420–25, vol. 10, No. 4.

* cited by examiner

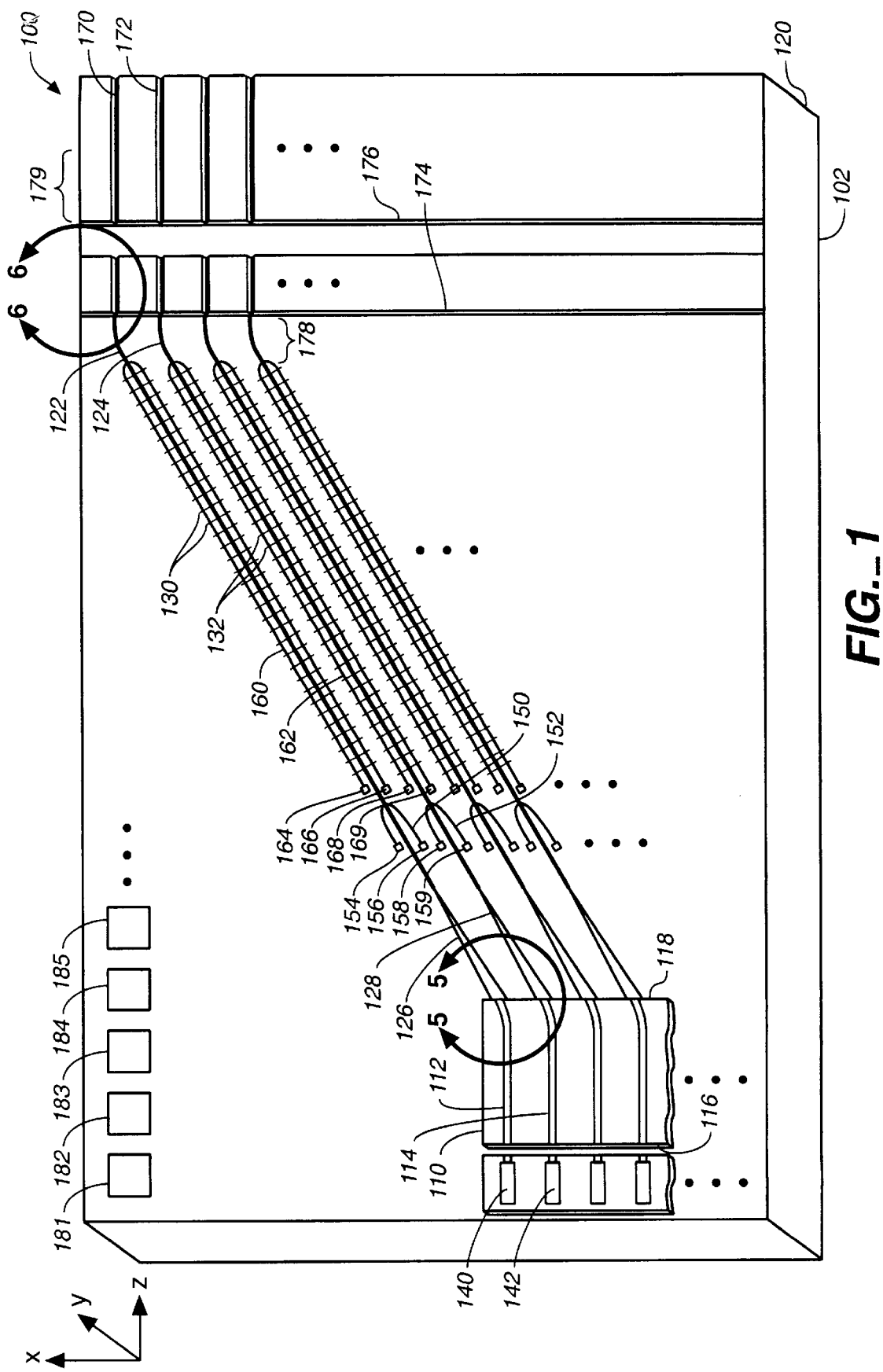

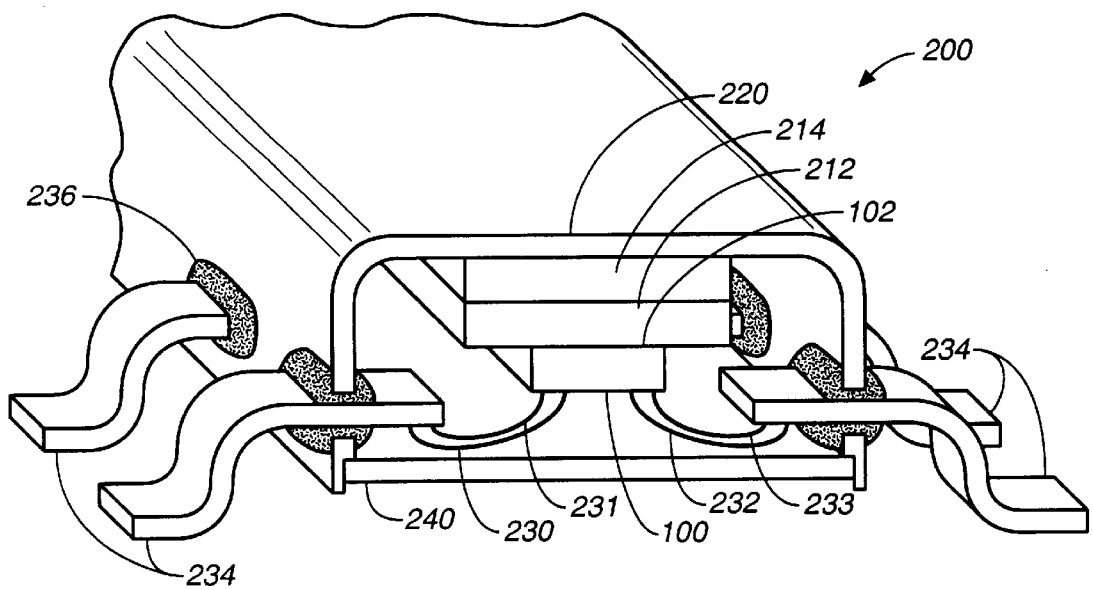
FIG._2
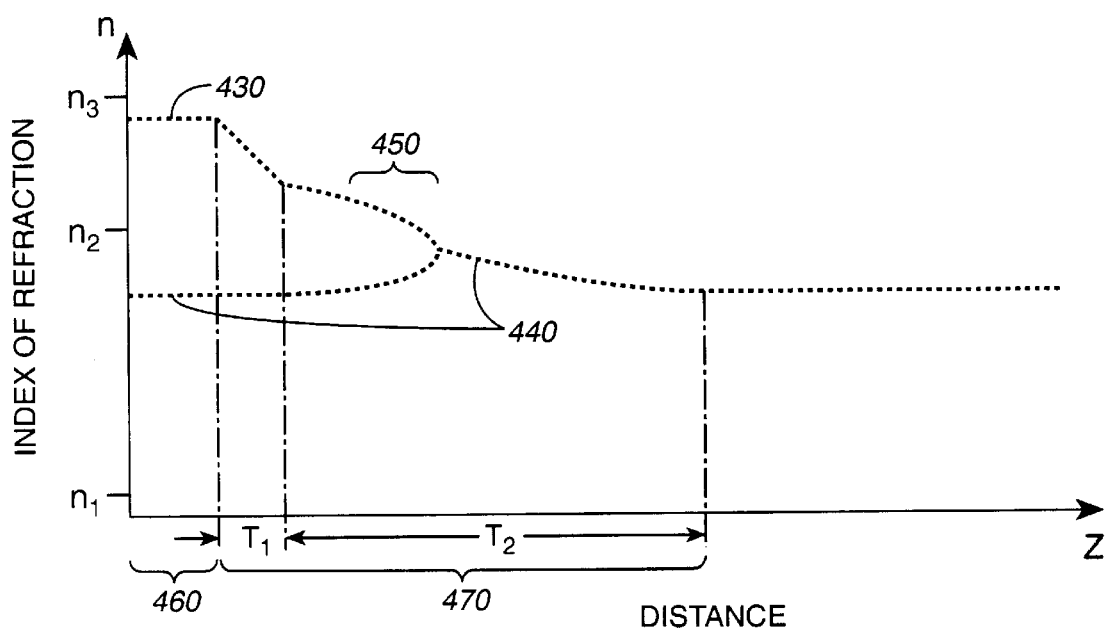
FIG._4

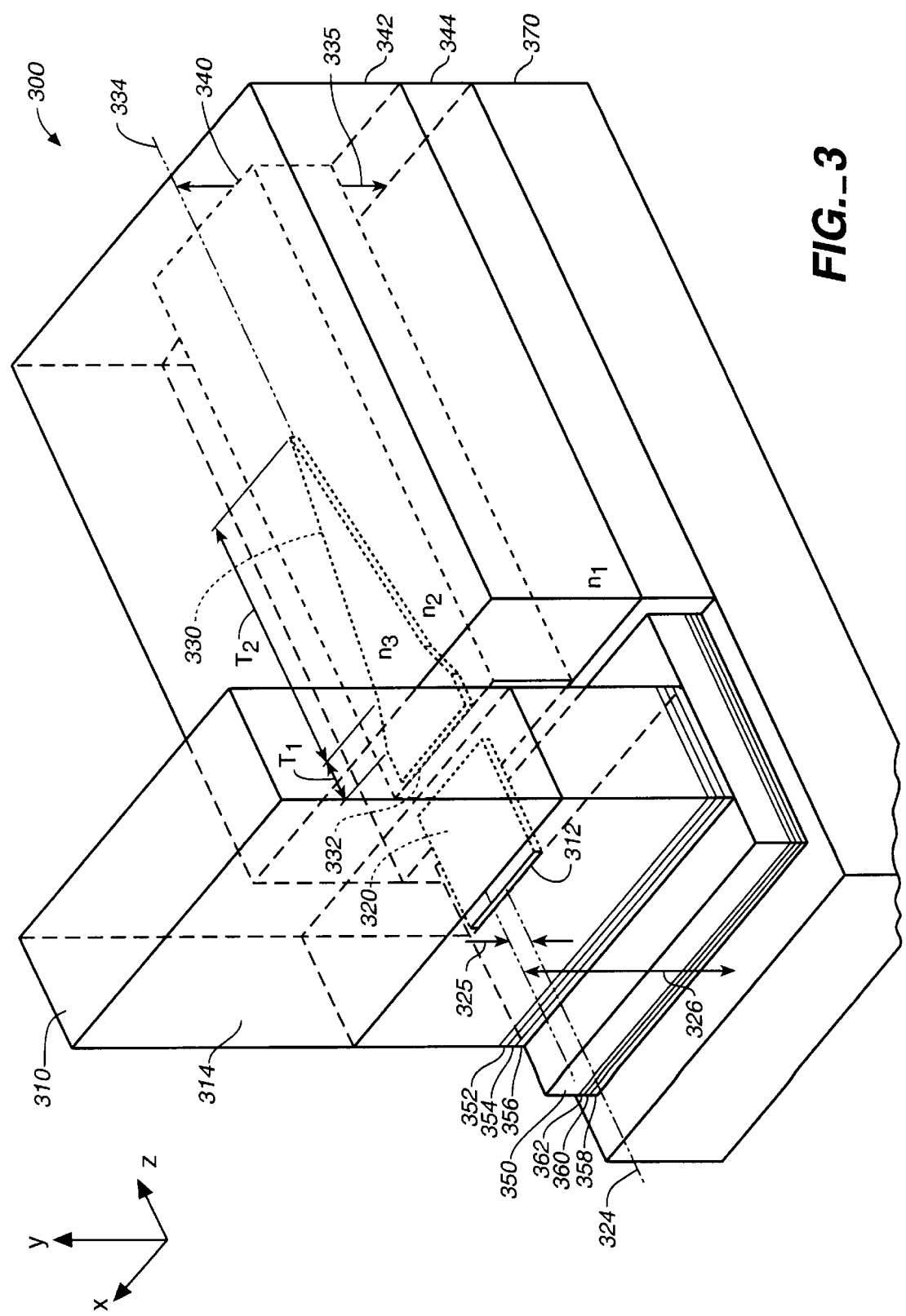
FIG._3

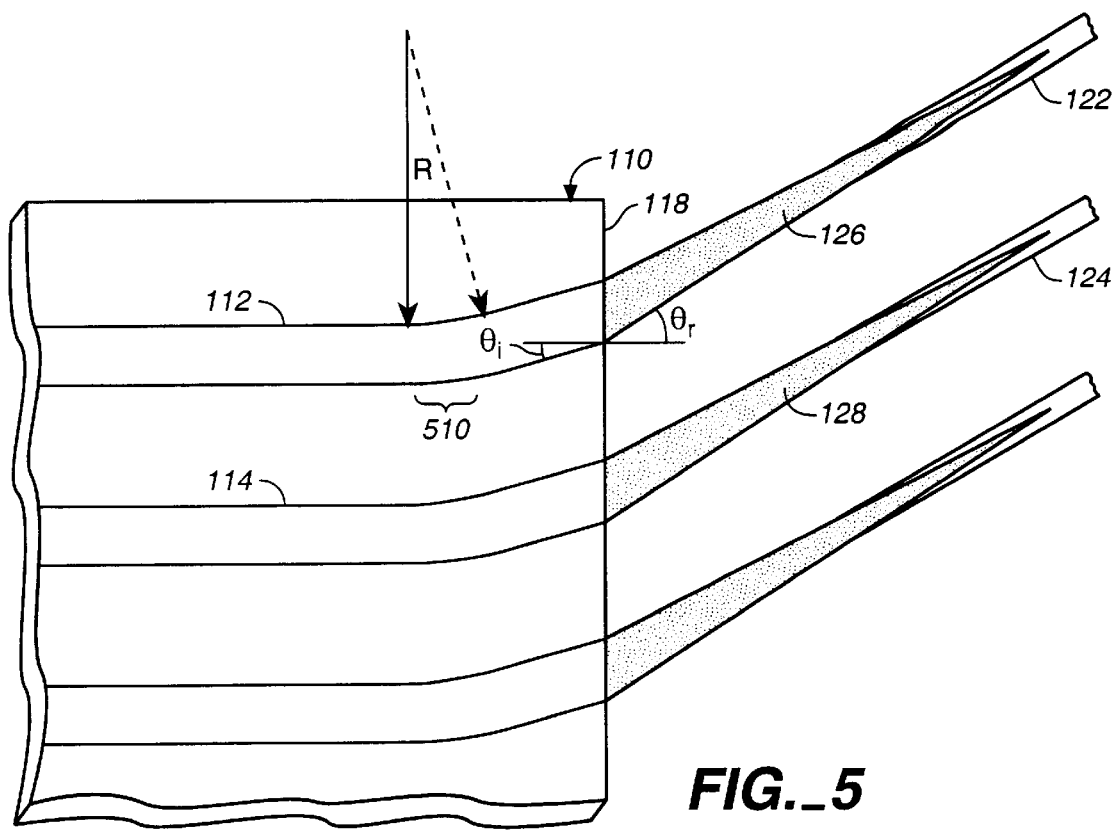
FIG._5
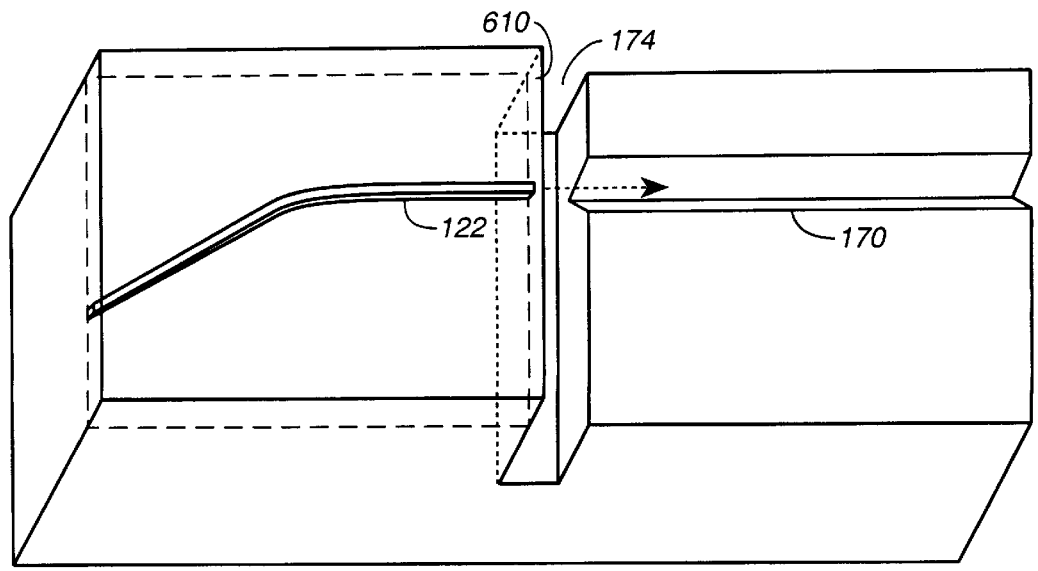
FIG._6

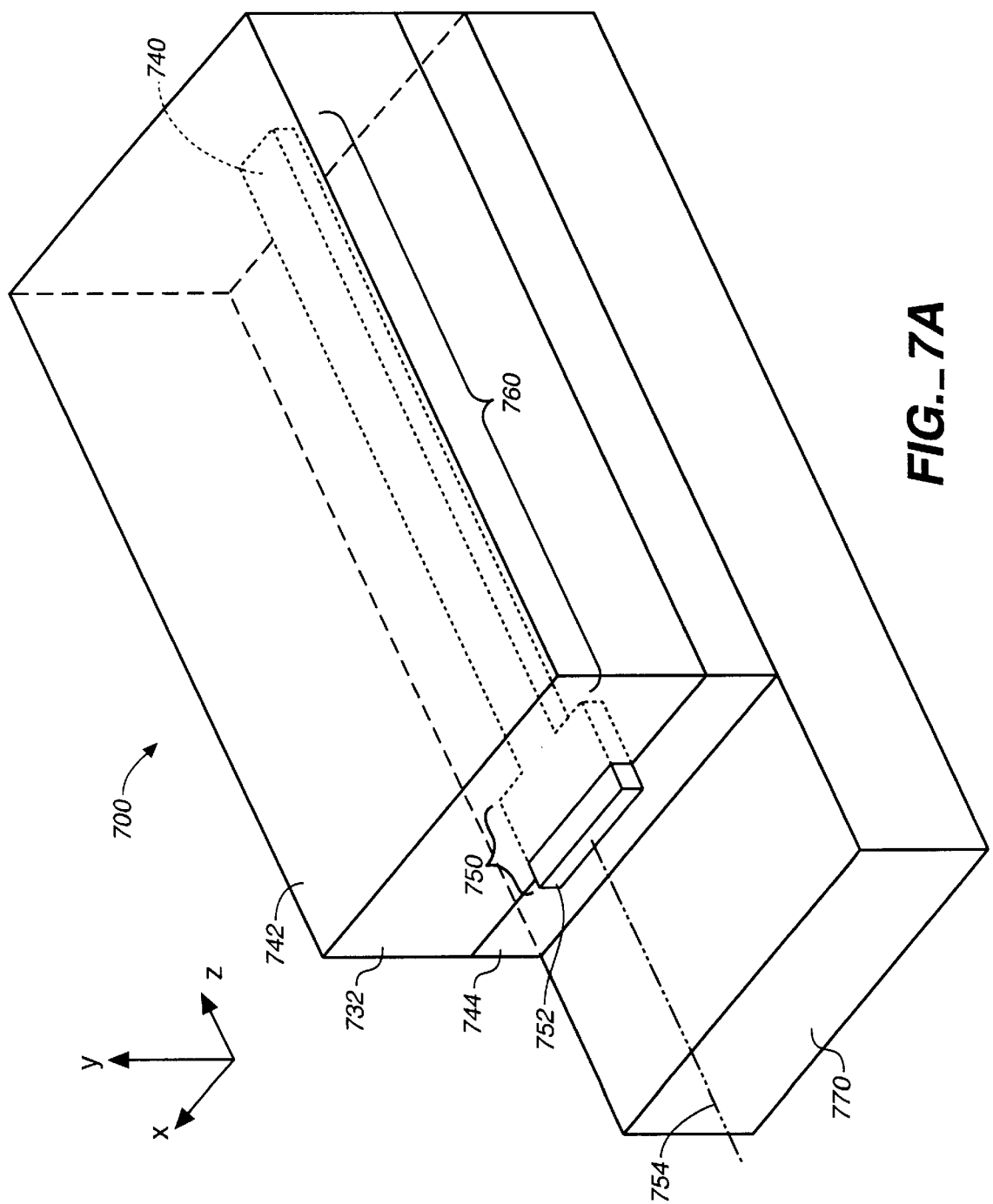
FIG._7A

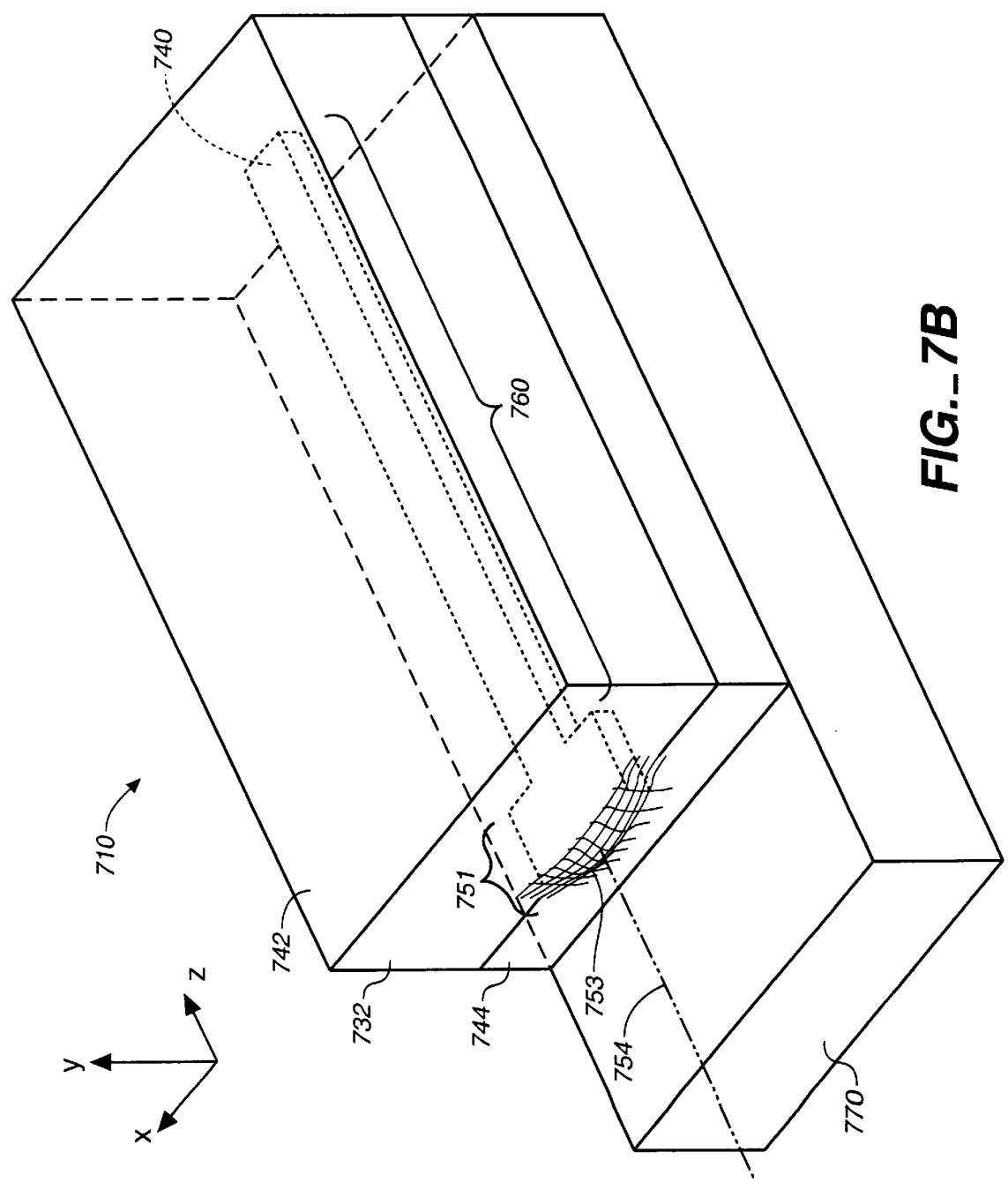
FIG._7B

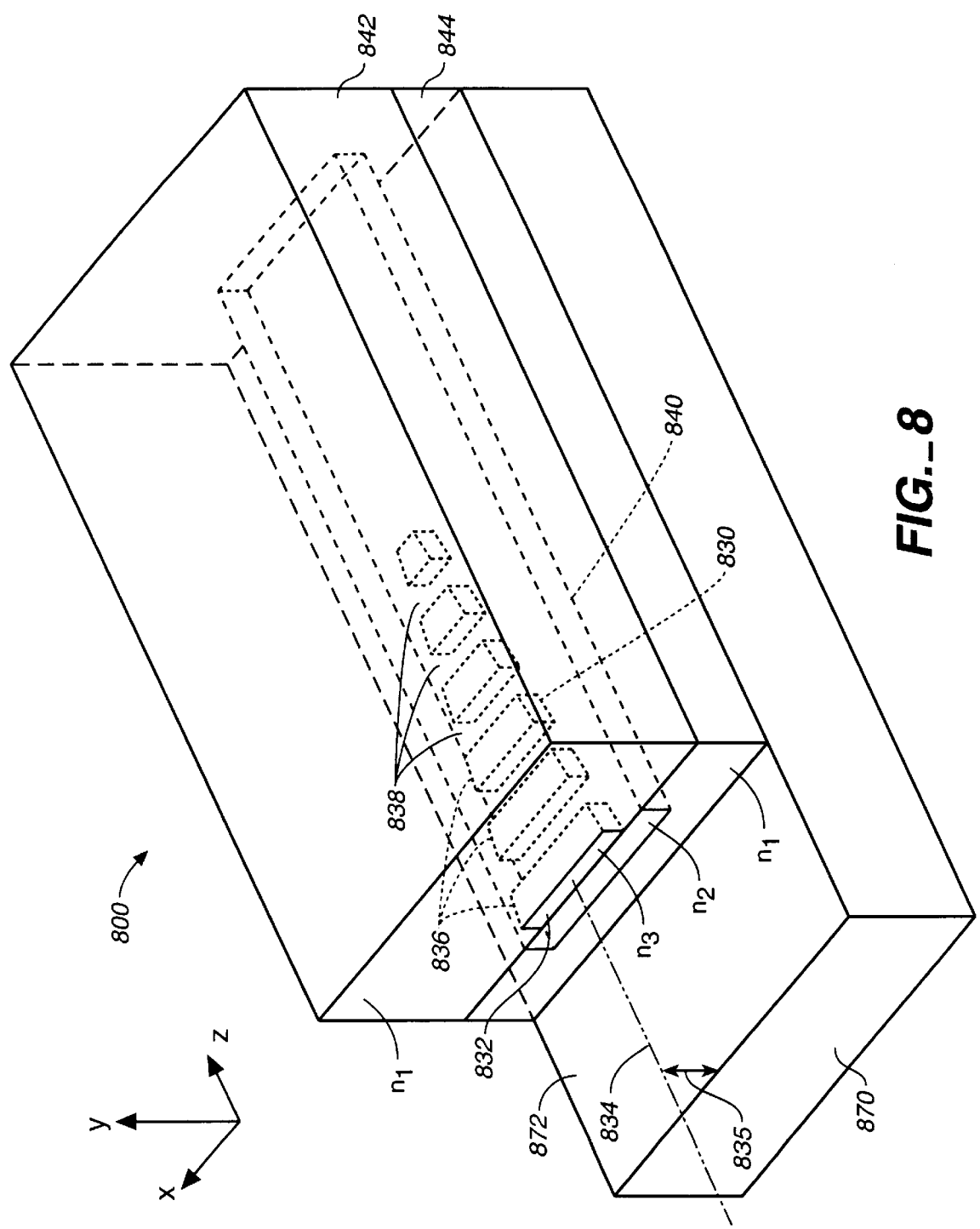
FIG._8

LENTICULAR STRUCTURE FOR INTEGRATED WAVEGUIDES

CROSS-REFERENCE TO RELATED APPLICATIONS

This application is being filed concurrently with U.S. patent application Ser. No. 09/438,886, entitled TAPERED OPTICAL WAVEGUIDE COUPLER, by David A. G. Deacon, the disclosure of which is incorporated herein for all purposes.

STATEMENT AS TO RIGHTS TO INVENTIONS MADE UNDER FEDERALLY SPONSORED RESEARCH AND DEVELOPMENT (none)

BACKGROUND OF THE INVENTION

Tapered waveguides are useful for efficiently interconnecting waveguides that support modes of different dimensions. Semiconductor laser chips typically contain waveguides that tightly guide the optical mode, while the optical fiber that transmits the laser light guides weakly so that the modes match poorly if the laser is connected directly to the fiber. Many approaches have been used to improve the efficiency of such interconnections. Vertical, lateral, and refractive index tapers were demonstrated by * R. Logan, U.S. Pat. No. 3,978,426, Aug. 31, 1976, and * R. K. Winn et al., IEEE Trans. Microwave Theory and Techniques MTT23 92 (1975), and * P. G. Suchoski Jr., et al., J. Light. Technology, LT5 1246 (1987). Both waveguide claddings and fibers have been tapered; see * J. Hammer, U.S. Pat. No. 4,773,720, Sep. 27, 1988, and * H. Schneider, U.S. Pat. No. 4,795,228, Jan. 3, 1989. Multiple stage tapers in the vertical and longitudinal directions were shown by * T. Koch, U.S. Pat. No. 4,932,032, Jun. 5, 1990 and * P. Melman, U.S. Pat. No. 5,261,017, Nov. 9, 1993. Pairs of coupled waveguides have been shown with single and multiple horizontal and vertical tapers by * Y. Shani et al., Appl. Phys. Lett. 55 2389 (1989), * E. Kapon, U.S. Pat. No. 5,078,516, Jan. 7, 1992, * Zengerle et al., Elect. Lett. 28 631 (1992), * B. Stegmueller, U.S. Pat. No. 5,199,092, Mar. 30, 1993 and * R. Smith et al., IEEE Photon. Technology Lett. 8 1052 (1996). Segmented tapers are shown by Z. Weissman et al., J. Light. Technology, 11 1831 (1993), and R. Adar, U.S. Pat. No. 5,577,141, Nov. 19, 1996. A good deal of effort has also been expended recently on optimizing integrated tapers in semiconductor lasers. However, the practical constraints that apply to any specific implementation tend to require different coupling approaches depending on both materials and geometry: the processes used to manufacture and package a product must be compatible with each other, with the materials used, and with the component layout. A unique geometry of taper and waveguides is required to optimize the coupling between a laser chip that is to be butt coupled in a hybrid configuration to a planar waveguide chip.

SUMMARY OF THE INVENTION

According to the invention, a waveguide is fabricated on a substrate with a protrusion of the core material extending from the cladding surface. The protrusion and the waveguide are coupled for refracting light propagating along an axis of the waveguide. In a first method, the protrusion is fabricated by etching across the waveguide propagation axis, through core and cladding materials to reveal a second etching surface that is preferentially etched. In one variation, the cladding material is etched faster than the core, forming a projection from the surface. In another variation, the core material is etched faster than the cladding, forming an indentation in the surface. The radius of curvature of the protrusion depends on the core dimensions, and may be changed by changing the waveguide dimensions. Two independent radii of curvature are formed from a waveguide with a core of rectangular cross section; these two different radii may be used to couple an astigmatic beam efficiently into the waveguide. The waveguide may have a transition from the rectangular cross section to another cross section within a short distance of the surface. The protrusion may also be covered with a material of dissimilar index of refraction. In a specific embodiment, the waveguide is fabricated from silica structures doped with Ge within the core region, using reactive ion etching to reveal the second etching surface, and a liquid etchant to preferentially etch the protrusion. A heating step such as by laser illumination may also be used to smooth and reshape the surface of the protrusion.

The invention will be better understood upon reference to the following detailed description in connection with the accompanying drawings.

BRIEF DESCRIPTION OF THE DRAWINGS

FIG. 1 is an embodiment of a hybrid grating stabilized laser chip.

FIG. 2 is a packaged embodiment in cutaway view of a thermally stabilized integrated optic chip.

FIG. 3 is an embodiment of a laser chip coupled to a tapered waveguide.

FIG. 4 is an illustration of the z-variation of the effective mode indices of two coupled waveguides in a tapered waveguide chip.

FIG. 5 is a top-view schematic diagram of a curved laser waveguide array with an angled interface to a tapered waveguide array.

FIG. 6 is an embodiment of a coupling region between a waveguide and a V-groove.

FIG. 7A is an embodiment of a waveguide-end lens.

FIG. 7B is an alternative embodiment of a waveguide-end lens.

FIG. 8 is a segmented embodiment of a tapered waveguide coupler.

DESCRIPTION OF SPECIFIC EMBODIMENTS

Thermo-optic materials are both convenient and robust, and may be incorporated into optical devices that actuate or tune upon the actuation of a heater. However, for applications such as communications, thermally insensitive devices are required for reliability. This invention describes a unique way of including a highly thermally sensitive tuning component into a device that is, in key aspects of its operation, insensitive to temperature. In one embodiment of the invention, a frequency tunable laser is described that emits light which may be channel-switched among a set of prepared frequencies that are independent of temperature. In another embodiment of the invention, a frequency tunable cross-connect device is described that cross-connects a frequency which may be channel-switched among a set of prepared frequencies that are independent of temperature.

Tunable Laser Operation

As is known in the art, laser tuning involves two factors that are typically interdependent: a) tuning a frequency selective element such as a grating within whose interaction band operation will occur; and b) tuning the longitudinal modes of the laser that determine the exact optical frequency that will lase within the band of the frequency selective element. In the DBR (distributed Bragg reflector) laser, for example, changing the chip temperature shifts both grating and mode frequencies, typically at different rates, leading to mode hopping behavior.

In this invention, means are described for making the cavity free spectral range (FSR) independent of temperature for high reliability. Further, the cavity round trip optical length may be adjusted according to methods described herein to adjust the FSR to equal a specified frequency channel spacing. The cavity is thereby prepared to lase at the desired optical frequencies. If the cavity is designed to be athermal, it may also provide an absolute frequency reference to the communications channel frequencies independent of drifts in environmental temperature, and no external reference devices such as a wavelocker need be provided. The free spectral range of a cavity is given by:

$$FSR=c/(nL)_{eff} \quad (1)$$

where the round trip optical length $(nL)_{eff}$ is $$(nL)_{eff}=\Sigma_i(n_{i\ eff}L_i) \quad (2)$$

and where $n_{i\ eff}$ is the effective index of refraction of the mode in the $i^{th}$ segment traversed by the light in the cavity, $L_i$ is the physical length of the $i^{th}$ segment, and the sum is over all the path segments traversed in a round trip of the cavity. The effective index of an optical mode in a waveguide is the index of refraction of an equivalent uniform medium that would give a plane wave the same propagation constant $$\beta=2\pi n_{eff}/\lambda \quad (3)$$

or wavenumber (where the electric field of the mode varies as $E\ e^{i\beta z}$ along the direction of propagation).

In an aspect of the present invention, the free spectral range of the cavity may be designed to equal a predetermined DWDM channel spacing set by a system integrator or by the ITU (International Telecommunications Union). In the preferred embodiment, the FSR is 50 GHz so that the effective round trip optical length of the cavity is 6000 microns. With the linear cavity shown in FIG. 1 and a preferred InP semiconductor laser chip length of 400 microns at an index of about 3.3, the optical length of the waveguide path between the edge of the laser chip and the start of the grating is about 1680 microns. If the effective index of the waveguide is about 1.45, its physical length is about 1160 microns, ignoring the small butt-coupling gap between the two waveguides.

In a variation of the preferred embodiment, the free spectral range of the cavity is designed to equal a rational fraction of a desired communications channel spacing $$FSR=(\text{communications channel spacing})\cdot n/m \quad (4)$$

where n and m are integers. If the desired channel spacing is 50 GHz, for example, FSR=50·n/m GHz. This may be useful if n/m<1 to increase the physical length of the resonator by a factor of m/n, simplifying design and fabrication issues. In one example, if n=1 and m=2, the rational fraction is ½ and the desired cavity round trip optical path becomes 12000 microns, allowing more than double the space in the resonator for thermal compensation material, taper, etc. In this situation, the grating tuning requirements are still the same, but the laser frequency will hop in 25 GHz increments if the grating is tuned continuously, with every other hop bringing the optical frequency to a desired communications channel. (Some communications systems can use 25 GHz channel spacing, in which case m=1 for this cavity length.) Or it may be useful if n>1 to interleave successively addressed frequency channels. In another example, if n=2 and m=1, the rational fraction is 2 and the laser will hop successively to every second communications channel, which might be useful for interleaving two devices in the frequency domain, or for increasing device stability against perturbations, ageing, and drifts. These approaches may also be combined, as in another example, with n=2 and m=3 where the round trip optical path becomes 9000 microns, and the laser frequency during operation will hop first to +33.3 GHz, then to +66.6 GHz, both frequencies in-between communications channels, and then to +100 GHz, a communications frequency two 50 GHz intervals away from the starting channel.

Athermal Cavity

In another aspect of the invention, a region of thermo-optical polymer may be incorporated within the laser resonator where the negative thermo-optic coefficient is exploited to produce an athermal free spectral range. For the FSR to be athermal or independent of device temperature, the device parameters may be chosen to satisfy the relation:

$$d(nL)_{eff}/dT=\Sigma_i(dn_{i\ eff}/dT\cdot L_i+n_{i\ eff}dL_i/dT)=0 \quad (5)$$

within a tolerance, where the sum is taken over all the different longitudinal segments of the cavity along the optical path. See K. Tada et al., Optical and Quantum Electronics 16, 463 (1984). Since these quantities are all positive in the common non-polymeric materials including silica, silicon, InP, GaAs, glass, lithium niobate, lithium tantalate, etc., a hybrid or multiple material approach is needed. The conventional approach to achieving temperature compensation has been to make a large negative dL/dT in one of the lengths $L_i$ in the above summation (usually a path length in air) equal to the difference between two large lengths (usually overhanging members in a supporting structure, one pointing away from the cavity and the other pointing towards the cavity). By selecting an inward-pointing member to have a larger coefficient of thermal expansion than the corresponding outward-pointing member, the support structure can be arranged to reduce the path length Li as the temperature is increased. See for example W. Morey, U.S. Pat. No. 5,042,898, Aug. 27, 1991, "Incorporated Bragg filter temperature compensated optical waveguide device" and J M. Verdiell, U.S. Pat. No. 5,870, 417, Feb. 9, 1999, "Thermal compensators for waveguide DBR laser sources".

In the preferred embodiment of the present invention, a polymer material is used to provide the negative thermo-optic coefficient in the cladding of the waveguide, and the waveguide design is adjusted for a negative net change in index with temperature. The length of the polymer intracavity segment may be adjusted until equation (5) is essentially met, within a tolerance. Note that the material used need not strictly be a polymer; all that is necessary is the negative thermo-optic coefficient. This material is placed intracavity in order to affect the summation in equation (5). Since it is the effective index of refraction that appears in equation (5), it is sufficient that some optical energy propagating in the optical mode traverse the negative coefficient material in one segment of the round trip optical path. The polymer material may be used in the cladding or the core, or in both portions of the optical waveguide. Since the thermo-optic coefficient of polymers tend to be large, only a fraction of the optical mode volume swept out by the optical mode in a transit of the optical cavity need be occupied by polymer.

The cavity is preferably also made athermal without changing its FSR. To accomplish this objective, the preferred approach is to adjust the overlap factor and the thermal coefficient of the polymer while keeping the optical lengths at the values required for the desired FSR. With the above lengths, a round trip through the diode laser contributes about 0.2 micron/° C. to the first term of equation (5). Thermal compensation is achieved by the polymer waveguide if its net thermal coefficient (the change in the effective index of refraction with increase in temperature) is approximately $-9 \times 10^{-5}$ °C.$^{-1}$. (The second term of equation (5) is small.) While the core material in the preferred embodiment has a positive thermal coefficient and is traversed by the most intense part of the beam, the polymer cladding material has such a large negative coefficient that it can be effective in compensating the entire cavity.

The fraction of the optical mode power in the waveguide that propagates inside the polymer compensating material is given by the overlap factor $\Gamma_c$.

$$\Gamma_c = \text{(mode power propagating in the polymer)/(total mode power)} \quad (6)$$

which may lie in the range of a few tenths of a percent up to 40% or more, depending on the design of the waveguide core, and the placement of the optical polymer. For the preferred 2 micron square high contrast 2% silica waveguide on silica cladding, the exponential tails of the mode penetrate far out of the core into the polymer cladding. Assuming the index of refraction of the polymer has been adjusted in the preferred embodiment (by e.g. halogenation and/or mixing) to equal that of pure silica, the overlap factor is about $\Gamma = 40\%$ since the polymer material forms the cladding on three out of four sides of the rectangular waveguide core. A polymer material with dn/dT of about $-23 \times 10^{-5}$ °C.$^{-1}$ will achieve thermal compensation of this resonator. Materials with larger negative dn/dT may be used with a design that has proportionately smaller overlap factor or smaller physical length through the negative dn/dT material. For example, if a material with dn/dT of $34 \times 10^{-5}$ °C.$^{-1}$ is used, the desired overlap factor is reduced to 26% in the above structure.

The tolerance within which equation (5) is satisfied depends on the application. In the case of the communications application, a mode frequency shift of a fraction of the communications channel spacing, say 5 GHz, may be tolerated over a temperature range of operating temperatures, which might be only a fraction of a degree for temperature regulated devices, or as much as 5° C., 50° C., or even higher for unregulated packages. A 50° C. range would imply a tolerance of about +/−0.001 microns/C in equation (5). To achieve this tolerance in a real device, the waveguide lengths and the dn/dT of the polymer are preferably controlled to an accuracy of a fraction of a percent. Depending on the parameter values, the tolerance on the cavity length may rise to about 10 microns (for a wide 400 GHz channel spacing, for instance), or it may fall below one micron (for a narrow channgle spacing).

When the grating is integrated with the thermally compensated waveguide design described above, an advantageous wide tuning range results. The tuning range of the polymer clad grating regions 130, 132 is large both because of the large thermo-optic coefficient and large mode overlap factor of the polymer. When the temperature of the grating polymer is scanned over a 100° C. range, the grating wavelength tunes over approximately 9 nm for the above case of polymer material with $-23 \times 10^{-5}$ °C.$^{-1}$, and 40% overlap factor.

In operation, the device will settle to a given temperature profile along the optical path of the resonator. The laser amplifier generates heat, and will rise to a temperature above that of the polymer waveguide. Heaters or coolers attached to the device, such as a substrate heater or the TE cooler described in reference to FIG. 2, may also change the temperatures of the gain section and the intracavity waveguide. Once the device in operation has reached equilibrium, the thermal profile will vary spatially along the waveguide but it will be constant in time. Changes in ambient temperature will change the entire profile approximately by a constant amount. Particularly if the thermal conductivity of the substrate is large, such as is the case for the preferred silicon substrate, changes in ambient temperature will produce spatially uniform changes in the thermal profile. Such changes in temperature do not substantially change the mode positions or FSR in an athermal cavity as described by equation (5).

Laser Embodiment

FIG. 1 shows a preferred embodiment of the hybrid tunable laser chip 100. A semiconductor laser chip 110 is flip-chip bonded to the substrate chip 120 producing a hybrid of two integrated waveguide chips. The laser chip is preferably fabricated from InP so that it emits in the 1550 nm region or the 1310 nm region. The waveguides 112 and 114 provide optical amplification when excited by sufficient injection current, over an operating band of optical frequencies including a desired wavelength such as 1550 nm or 1310, 980, 860, 780, 630, or 500 nm, or another useful wavelength region. For a 1550 nm laser, a typical gain bandwidth would be about 50 nm (such as from 1520 to 1570 nm or from 1560 to 1610 nm), and would overlap a portion of the amplifying bandwidth of the Er-doped fiber amplifier either in the conventional band or one of the extended operating bands. The gain bandwidth may be smaller for lower injection current, or as large as 120 nm or more for high injection current and proper quantum well design. The two waveguides 112 and 114 of the laser chip are aligned in the x-z plane to butt couple to two passive (they provide no gain) waveguides 122 and 124 fabricated on the substrate chip. A substantial fraction of the energy emitted from the laser waveguides 112 and 114 is coupled into the planar integrated waveguides 122 and 124, where the coupling loss is preferably less than 10 dB or even less than 4 dB. Vertical alignment (in the y direction) of the laser chip 110 is obtained by controlling the thicknesses of the process layers in and on the laser chip and the substrate. Light emitted from the laser waveguides 112 and 114 is coupled into the waveguides 122 and 124 at the aligned butt coupled coupling region. Alternative gain regions include variations on the active region of semiconductor diode lasers, and fiber lasers, dye lasers, color center lasers, solid state lasers generally, or other amplifying media capable of providing optical gain over a useful frequency band.

Tapered waveguide segments 126 and 128 maybe used to improve the coupling efficiency between the differently shaped waveguides 112 & 114 and 122 & 124. See FIGS. 3, 4, 7A, 7B, and 8.

The waveguides 122 and 124 may be integrated on the substrate 120 by one of a variety of common fabrication techniques. In the preferred approach, as is known in the art, silica waveguides are fabricated with low loss and good reproducibility using the flame hydrolysis method. In flame hydrolysis, layers of particles produced in a flame (silica soot) are deposited onto the surface with a chemical composition determined by the inputs to the flame. Compaction of the particles into a solid film is typically accomplished during a subsequent high temperature consolidation process. Such waveguides are commercially available in various index contrasts using Ge doped core material, including 0.4%, 0.75% and 2%. Ge doped material has the further advantage of being sensitive to UV irradiation as is known in the art, allowing patterned regions of increased index of refraction (such a grating) to be fabricated by exposure to patterned beams of light. Other dopants are also known to have light-sensitive index of refraction, which may occur as a result of a change in valence state. Most useful layer thicknesses are available, including core thicknesses in the range of 1 to 10 microns and beyond, and cladding thicknesses in the range of a few microns to hundreds of microns, if desired. Channel waveguides can be commercially fabricated according to customer design. Channel waveguides are typically fabricated by reactive ion etching (RIE) after deposition of the core material on the lower cladding material. The RIE step removes the higher index core material outside masked regions where retention is desired to establish light guiding. Subsequent to the channel waveguide fabrication, a top cladding of silica may or may not be applied according to the desires of the customer. If applied, the top cladding material is typically identical to the lower cladding material (pure silica) in index, surrounding the core material on all sides with cladding. In the preferred embodiment, we have selected high contrast, 2% waveguide core material, with a 2×2 micron channel dimension.

As an alternative the waveguides may be fabricated from spun-on polymer layers chemically selected with a raised index for the core layer, and patterned by RIE. Alternative substrates include InP, GaAs, glass, silica, lithium niobate, lithium tantalate, etc. Alternative waveguide materials include oxides such as $Ta_2O_5$, $Nb_2O_5$, $TiO_2$, $HfO_2$, and $SiO_2$, semiconductors such as silicon, GaAs, InP, polymers, and doped or mixed versions of all of the above materials with various dopants including phosphorus, hydrogen, titanium, boron, nitrogen, and others. Alternative fabrication methods include in diffusion, sputtering, evaporation, wet and dry etching, laser ablation, bleaching, and others. Many different waveguide structures are also available including planar, rectangular, elliptical, ridge, buried ridge, inverted ridge, diffused, air clad, hollow, coated, cladding stripped, 3-layer, 4-layer, 5-layer, etc. Combinations of the above materials, methods, and structures may be used as long as the process flows are compatible (i.e. do not result in decomposition, delamination, or unacceptable chemical change or physical modification of the materials of the semi-processed article), the optical losses are reasonably low (i.e. below 10 dB/cm for very short chips and below about 1 dB/cm for longer waveguides), and the transverse index of refraction profile of the finished structure has a locally higher index of refraction compared to adjacent materials in at least one dimension, creating at least a planar waveguide that guides light in one dimension or a channel waveguide that guides light in two dimensions.

In a preferred embodiment, the waveguides 122 and 124 have a polymer structure, fabricated with a silica under cladding, a patterned Ge-doped silica core, and an over cladding of a polymer material whose index of refraction has been selected to approximately equal (within a tolerance of less than about 1.5%) the index of the silica under cladding. The preferred polymer material is a deuterated and halogenated polysiloxane such as is described in M. Amano, U.S. Pat. No. 5,672,672, Sep. 30, 1997, as Compositions (G), (H), (13), (14), (18), (20), (23), or (24). Other polymer materials can also be used, including polysiloxanes, acrylates, polyimides, polycarbonates, etc., with optional deuteration or halogenation to reduce optical losses in the infrared, adjust the index of refraction, and adjust adhesion to other layers. Depending on the layer thicknesses, waveguide stripe width, and refractive indices, a substantial fraction of the mode energy propagates in the polymer cladding. This fraction may vary from a very small fraction of a percent up to many tens of percent.

The waveguides 112 and 114 are preferably curved near the front facet 118 of the laser chip so that the butt coupled interfaces lie at an angle to the direction of propagation of light in the waveguides, reducing the feedback from the coupling region. The front facet 118 may alternatively be antireflection coated, index matched, etc. These measures diminish the feedback from the front facet relative to the frequency selective feedback from the grating regions 130, 132, increasing the stability of the system.

FIG. 5 shows a detailed top view of the coupling region between the diode laser chip 110 and the waveguide 122. The laser waveguide 112 meets the HR-coated rear facet 116 of the diode laser at nearly normal incidence for good coupling of light reflected from the facet 116 back into the waveguide. However, the waveguide is preferably curved in the region 510, with a radius of curvature R, so that it meets the front facet 118 (which is preferably parallel to the rear facet 116) at an angle $\theta_i$. The performance of curved waveguide diodes is described in some detail in C-F. Lin et al., IEEE Phot. Tech. Lett. 8, 206, (1996). The angle $\theta_i$ is chosen to be large enough (preferably about 8°) so that the reflection from the interface at the front facet 118 does not re-enter the waveguide, preventing feedback from this interface. The minimum desired angle depends on the contrast and dimensions of the waveguide, but as a rough rule of thumb it can be chosen larger than about 5° for a tight waveguide. Since the effective optical index of refraction inside the laser chip is approximately n=3.3 and the effective index of the tapered waveguide segment 126 is about 1.49, the angle $\theta_r$ of the output waveguide will be approximately $\theta_r=18°$.

As mentioned in reference to FIG. 3, an index matching material is preferably applied in the gap between the laser chip 110 and the waveguide segments 126, 122. The gap is more clearly shown in reference to FIG. 3 between the tapered waveguide 330 and the laser waveguide 320. The interface region includes two interfaces, one between the laser waveguide 320 and the material in the gap, and a second between the material in the gap and the tapered waveguide 330. The gap may be filled with air, vacuum, or a material with an index of refraction close to but preferably somewhat above the geometric mean of the effective indices of the laser waveguide 320 and the tapered waveguide 330. (Referring to FIG. 1, if the waveguide structure 122 and the tapered waveguide segment 126 are fabricated after the attachment of the diode laser to the substrate there may be no gap at this interface.)

As an alternative to the butt coupling arrangement between the two waveguides shown in FIG. 1, many other coupling approaches may be used, including lens coupling, grating coupling, and parallel coupling (including vertical coupling), and grating assisted coupling, as is known in the art. In the case of vertical coupling, the waveguide 122 is disposed parallel to and vertically separated from the diode laser waveguide 112, as would be obtained if the stripe waveguide 122 is fabricated directly on top of the diode laser waveguide. The coupling between the two waveguides may be that of a broadband directional coupler, or it may be that of a narrower band grating assisted coupler.

Monitor photodiodes 140 and 142 may be placed to receive a portion of the light generated from the laser chip, in this case in proximity to the rear facet 116 of the laser which has preferably been high reflection (HR) coated, but which still transmits a portion of the light incident on the facet. As shown, the monitor photodiodes 140, 142 are preferably waveguide detectors butt-coupled to the laser waveguides 112, 114. This butt coupling is non critical since the laser power is high and high detector efficiency is not critical. A large separation between the laser and monitor chips on the order of 50 microns or more is acceptable, making possible reduced positioning tolerance for this chip possible. If desired, one of many known configurations for the disposition of surface photodiodes may alternatively be used.

Grating regions 130, 132 are tunable frequency selective feedback structures that reflect a portion of the light traveling in the stripe waveguides 122, 124, providing feedback into the laser chips, and determining the wavelength regions in which the lasers oscillate (see E. I. Gordon, U.S. Pat. No. 4,786,132, Nov. 22, 1988, "Hybrid distributed Bragg reflector laser"). The grating regions 130, 132 and the rear facet 116 of the laser chip form the cavity mirrors for the laser oscillator of a hybrid external cavity, grating stabilized laser. The waveguides 112 and 114, the butt coupling regions, and a segment of the stripe waveguides 122, 124, respectively, including the tapers, form the intracavity optical path for propagation of optical energy within the resonator. These grating regions 130, 132 are shown in a separate segment of the stripe waveguides 122, 124 from the tapered waveguide segments 126, 128. These separate segments of the waveguide may be identical to or may differ from the other segments of the waveguide either in structures or in materials. The grating structure may be fabricated in the core layer, one of the cladding layers, or in multiple layers.

When the drive current through the laser waveguide 112 exceeds a threshold value, the gain provided exceeds the round trip optical loss of the oscillator, and laser operation is obtained. The FSR of the linear cavity of FIG. 1 is determined by the optical length between the first grating element and the rear facet 116 of the laser amplifier chip. The partial waves of the reflections from the other grating elements add in phase to determine the spectral characteristics of the grating reflection. Together, these partial waves also establish the amplitude and phase of the grating reflection coefficient at the location of the first grating element. Changes in index within the grating affect its spectrum but not the FSR of the cavity, whether those changes in index are uniform or have a complicated profile due to heating, the application of an electric field to electro-optic material, the application of stress, etc.

For single frequency operation as is required for high bandwidth communications, the width of the grating interaction band is preferably much smaller than the gain bandwidth of the amplifier but comparable to the FSR of the resonator containing the amplifying waveguide. If the full width at half maximum of the main grating reflection band equals the longitudinal mode spacing, only one mode at a time will lase. Adjacent modes will have lower gain, and will be clamped below threshold until the grating band is tuned far enough to equalize the modal gain of two adjacent modes. When gain equality is obtained for two modes during tuning, the operating frequency of the laser will jump suddenly from the oscillating mode to the adjacent mode the grating is tuning towards. It may be sufficient for the grating band full width at half maximum to be substantially larger than the FSR, but the laser stability will begin to become compromised as the band width becomes significantly larger. There are some advantages to having the band width smaller than the longitudinal mode spacing, but the laser might become power modulated or even extinguished as tuning progresses.

By modulating the drive current, the laser intensity may be modulated, thereby modulating the output power coupled out of the stripe waveguides 122, 124 into the output fibers. The stripe waveguides 122, 124 may be modulated with separate data, providing multiple independent output channels, or simultaneously with the same data stream, providing a dual output device that can be independently routed to the desired destination for e.g. data communication protection purposes. Laser modulation may be accomplished by modulating the drive current through the stripe waveguides 122, 124, or externally as is known in the art. Direct modulation is accomplished with low chirp in this configuration because changes in the drive current do not modulate the index of refraction of the grating regions 130, 132, and because the effective index of most of the optical path of the cavity is not modulated. The maximum rate of modulation is typically limited by the round trip time in the cavity to a fraction of the FSR, so if the FSR is set at 50 GHz, the modulation rate may be limited to 10 to 20 GHz.

Since the amplifier chip generates heat, changes in the average drive current will also change the longitudinal mode positions. It is therefore preferable to establish an average drive current that is maintained during operation. A constant drive current may be maintained during modulation using a transition-keyed modulation scheme, for example, if necessary. As the laser ages, its average drive current must rise to maintain constant output power and good modulation characteristics. It may be desirable to apply a compensating level of current to intracavity heater traces such as 150 and 152, for example, to maintain the channel frequencies despite the ageing-related rise in laser temperature.

The grating regions 130, 132 are preferably fabricated by patterned exposure through a phase mask as is known in the art. The grating may be fabricated in the Ge-doped silica core after sensitization with hydrogen or deuterium, or it may be fabricated in the polymer cladding prior to full cure so that the cladding material is still subject to chemical change such as by crosslinking. Alternative grating fabrication methods include exposure with interfering beams, patterning and dry- or wet-etching, or direct patterned etching, all of which are known in the art and may be applied to either core material or cladding material. For a purely periodic grating, the Bragg wavelength $\lambda_B$ for peak reflection in the retroreflecting configuration shown is given by $$\lambda_B = 2n_{eff}\Lambda/m, \tag{7}$$

where $\Lambda$ is the grating period, $n_{eff}$ is the local effective index of refraction of the mode, and m is the order of reflection. The result in equation (7) follows from the requirement that to accomplish phasematching, the wavenumber of the grating $2\pi/\Lambda$ must equal the sum of the forward propagating wavenumber in the waveguide and the reverse propagating wavenumber in the waveguide. With an effective index of about 1.446, Bragg wavelengths of 1552 nm and 1310 nm are obtained with grating periods of 537 nm and 453 nm, respectively. The exact wavelength of operation depends on all of the optical parameters of the waveguide, including the grating periods, and the refractive indices and thicknesses of the films traversed by the optical energy of the optical mode.

In practical devices, gratings are rarely strictly periodic, and the grating period, the grating index modulation, and the waveguide effective index of refraction may be varied along the length of the waveguide to achieve various effects such as apodization as is known to reduce sidemode reflection, to create multiple grating peaks as known for example in superstructure gratings and sampled gratings etc., or in general to engineer the shape of the reflection spectrum. In a laser resonator (or oscillator or cavity), it is preferable to chirp the grating period towards shorter period (in the direction of light propagation away from the amplifying waveguide segment) both for enhanced oscillator stability as shown by P. A. Morton et al., Appl. Phys. Lett. 64 2634 (1994), and for reduced sidelobe amplitude on the grating reflection bands as shown by A. Gnazzo et al., Integrated Photonics Research Conference, Optical Society of America, p. 410 (1996). The waveguide parameters such as lateral guide width may also be spatially varied, changing the effective index and the grating frequency as is known in the art.

The optical frequency band over which reflection occurs may take on very different forms according to the shape of the grating spectrum which may have only a single narrow peak, a broad peak, or a more complex multipeaked structure. The shape of the spectrum depends on the detailed design of the optical phase advance along the grating structure. A single peaked grating may be used to select a single channel, and a broad band or multipeaked grating may be used to select multiple channels or provide vernier tuning, etc.

The grating may be tuned (shifting the wavelength range for interaction with light) by changing either the grating period of the effective index of refraction of the light propagating through the grating. The grating period may be changed by expanding the material by one or more of several means including mechanical stretching or compression, heating or cooling, acoustic excitation, etc. The effective index in the grating may be changed by one or more of several means including the preferred thermo-optic effect, the electro-optic effect, the piezoelectric effect, etc. Materials are available that change their index of refraction in response to thermal, electric field, compression, shear, and other applied changes, including nonlinear optical materials, crystals, liquid crystals, and other types of material known in the art. Any portion of the material traversed by the optical energy of the light mode along the grating may be changed to affect a change in the grating spectrum. The thermo-optic effect is preferred for shifting the reflection band in a near-term product due to the availability of reliable polymer materials with large dn/dT.

The thermo-optic effect is the property of some materials of changing their index of refraction with temperature. Heating a segment of the polymer waveguide changes the effective index of refraction predominantly through the thermo-optic effect. The effect of thermal expansion is relatively small. A few materials have large thermo-optic coefficient (dn/dT) such as the active waveguide of the InP laser (dn/dT=25×10$^{-5\circ}$ C.$^{-1}$), and a few materials have a small rate of change of index with temperature such as silica (dn/dt=1×10$^{-5\circ}$ C.$^{-1}$). Polymer materials are unusual in that their thermo-optic coefficient is negative and large (dn/dT in the range of −10 to −35×10$^{-5\circ}$ C.$^{-1}$), see for example R. S. Moshrefzadeh et al., J. Lightwave Tech. 10 420 (1992). In this invention, we use polymer layers along the optical path to tune grating interaction frequencies, to tune resonant frequencies, and to render devices athermal by compensating the positive thermal change in index of refraction of other materials traversed by the optical energy. Useful devices are produced including in particular the combination of both thermally insensitive structures such as resonators, and strongly thermally tunable structures such as polymer gratings.

Changes in the temperature of the grating do not affect the FSR substantially if there is no substantial "leakage" of the grating thermal spatial profile into the resonant cavity. The cavity as a whole is in the preferred embodiment made athermal (compensated to be insensitive to uniform temperature changes). However, individual segments within the cavity may still have a substantial thermal coefficient. In the preferred embodiment, the structure of the stripe waveguide 122 is the same in the grating region 130 and in the cavity between the tapered waveguide segment 126 and the grating region 130. To the extent that a portion of the thermal spatial profile from the heater trace 160 overlaps the laser cavity, tuning the grating with heater trace 160 will still produce a residual change in the mode frequencies. Ideally, the temperature tuning of the grating is accomplished by an abrupt spatial thermal profile that changes the temperature of the grating but that does not change the temperature of the intracavity waveguide structure. By designing the heater traces 160 and 162 for low heating of the intracavity waveguide region outside the length of the grating, and by providing a high thermal conductivity substrate 120 such as silicon, and by keeping the thickness of the process layers thin between the grating waveguide and the substrate (subject to other constraints), we can minimize the effect of the thermal tuning of the grating on the longitudinal modes, so that the full tuning range of the grating can be realized while limiting the undesired mode tuning to a tolerance such as an acceptably small fraction of one FSR. As an alternative, a segment of the intracavity waveguide adjacent to the grating could be designed athermal in the region of "leakage" of the grating thermal profile.

Under such conditions, tuning the Bragg wavelengths of the grating regions 130, 132 by means of the currents flowing through the heater traces 160 and 162 produces a series of discrete frequency jumps in the laser output (mode hops) from one longitudinal mode to the next, without changing the longitudinal mode frequencies. The optical frequency of operation tunes in a discontinuous, digital manner, without traversing the frequency range between the longitudinal modes of the cavity. If longitudinal modes coincide with communications frequency channels, the device changes communications channels digitally even though the current in the heater stripes may be changed continuously in an analog fashion. With digital tuning, the channel accuracy depends not on the accuracy of the tuning actuator (e.g. heater current), but on the accuracy of the specification of the channel frequencies.

A pair of serpentine heater traces 150, 152 may be disposed about the stripe waveguides 122, 124, at a location between the grating regions 130, 132 and the front facet 118. The heater traces 150 and 152 terminate in electrodes 154, 156, 158 and 159, respectively. Injecting a current through the electrode pair 154 and 156 excites the heater trace 150, raising the temperature of the stripe waveguide 122 along a portion of its length as determined by the pattern of the heater trace 150 and the diffusion of the heat away from the trace and (ultimately) into the substrate. Likewise, injecting a current through the electrode pair 158 and 159 excites the heater trace 152, raising the temperature of a portion of the stripe waveguide 124. The heater traces may be fabricated from stripes of resistive material such as platinum, nickel, Nichrome, conductive polymer, etc., and may be in the form of a single layer or of multiple layers as may be necessary to produce the desired properties of conduction or wirebonding or adhesion to the lower layer, or to modify the electrode response to subsequent process steps such as laser ablation, etching, etc. The stripe may be patterned as known in the art by lithographic means such as photo resist patterning followed by liquid or dry etch (e.g. chemical or RIE etch) of the resistive material and stripping of the resist. These electrodes and heater traces may be used to adjust the optical length of the round trip optical path of the hybrid external cavity grating stabilized laser, where the round trip optical path is the path followed by the optical mode through the resonator between successive passages through the same point in phase space in the resonator (such as a reflection from the grating or a coupling into an amplifying waveguide segment), and traversing the amplifier waveguide segment, and where $n_{i\ eff}$ is the effective index of refraction of the mode in the $i^{th}$ segment traversed by the light in the cavity, $L_i$ is the physical length of the $i^{th}$ segment, and the sum is over all the path segments traversed. The heaters lower the effective index of the waveguides through the thermo-optic effect in the polymer cladding material in the region determined by the heat flow adjacent to the heaters. This reduces the optical length of the resonator, increases the FSR and tunes the longitudinal modes to higher frequencies, all other factors being constant.

In an embodiment of the invention, the round trip optical length may be adjusted by means of the heater traces 150, 152 to adjust the optical length and the free spectral range so that some of the resonator longitudinal mode frequencies coincide with a desired set of communications frequency channels. Or, the heater traces 150, 152 may be used to tune the operating frequency of the device in a continuous analog fashion.

Serpentine heater traces 160 & 162 may be disposed about the stripe waveguides 122, 124, at a location within the grating regions 130, 132 and substantially traversing the entire grating regions. The heater traces 160, 162 terminate in electrodes 164, 166, 168, and 169. Injecting a current through an electrode pair 164, 166 excites the heater trace 160, raising the temperature of the stripe waveguide 122 along the grating region 130 as determined by the pattern of the heater trace 160, and the diffusion of the heat away from the trace and (ultimately) into the substrate. Again, the heaters lower the effective index of the waveguides through the thermo-optic effect in the polymer cladding material in the region determined by the heat flow adjacent to the heaters. The change in the effective index in the grating region tunes the frequency response of the grating. as in equation (7); heating a grating segment increases its frequency of interaction. The gratings may be tuned together or separately simply by controlling the respective heater currents or powers.

The stripe pattern of the heater traces 160 and 162 is preferably uniform along the grating to form a thermal change as a function of heater current that is uniform along the length of the grating, thereby largely maintaining the spectral shape of the grating interaction. As shown, the stripe pattern traverses both sides of the waveguide in the grating region so that the thermal change is also more uniform across the lateral dimension of the waveguide. Use of a single heater stripe along the waveguide is a reasonable alternative that offers the advantage that all the gratings may be grounded together at one end.

Although the heater traces 150, 152 are also shown as serpentine, uniformity is not a requirement for tuning the round trip optical length of the resonator. The electrodes or pads 154, 156, 158, 159, 164, 166, 168, and 169 are preferably made of gold or other material that resists oxidation in order to enhance the bonding of connection leads to the heater power supplies (not shown). The locations of these electrodes are not critical, and may be moved to other locations on the chip, provided that the connections between the electrode locations and the heater traces have low resistance to reduce unwanted power consumption. Many other heater and electrode designs are available and useful for accomplishing the purposes described above.

In a variation of the invention, the thermal profile along the waveguide induced by the heater stripes may be made nonuniform along the length of the gratings by various means including varying the width of the stripes, varying the distance of the stripes from the waveguide axis, etc., so that the spectral shape of the grating interaction may be changed by a distributed thermally induced phase shift as a function of the heater current.

For thermo-optically tunable gratings, while the cavity may be made athermal, the grating itself cannot be athermal. For this reason, it may be desirable to stabilize the absolute temperature of the substrate, limiting the frequency sensitivity of the grating to changes in ambient temperature. If the substrate is thermally stabilized, the heater power provided to the grating may also be used to determine the absolute operating frequency. Some drift in the grating frequency is acceptable provided it does not cause a mode hop, so the substrate stabilization requirement is not very stringent. (In electro-optic, piezoelectric, etc. devices, the gratings are preferably designed to be intrinsically athermal, eliminating the need for substrate thermal stabilization.) To stabilize the substrate temperature, a simple temperature sensor may be attached at or near the substrate with an electronic control feedback loop provided as is known in the art to actuate a heater and/or cooler (such as the thermo-electric "TE" cooler 212 shown in FIG. 2) and regulate the temperature within a desired range.

A curved waveguide region 178 may be provided in the stripe waveguides 122, 124 on the chip 100 to bend the waveguides back through the angle $\theta_r$ to provide output coupling to a set of optical fibers that is parallel to the diode laser chip, allowing easy scaling of the design to multiple lasers on the same chip. By expanding the chip laterally (in the x-direction), a wider laser chip with 3 or 4 or more waveguides can be provided and coupled to additional waveguides laid out adjacent to the existing waveguides, with taper, grating, and heater sections, as well as output fiber V-grooves. The dual-bend configuration allows this to be done with identical length segments for each separate waveguide. The radius of the curved waveguides in the region 178 may be chosen to optimize the bend loss; a good choice for our 2% contrast silica waveguides is a radius of curvature larger than or equal to about 2 mm. Notice that the bends have been placed outside of the resonant cavity to reduce the length of the resonant cavity (increasing its modulation bandwidth) and to reduce its loss. An alternative design (not shown) incorporating this bend before or after the taper but before the grating (and therefore inside the cavity) has the advantage of greater compactness since the grating regions will also be parallel with the laser chip.

V-grooves 170 and 172 may be provided to aid in coupling a pair of fibers (not shown) to the output ends of the stripe waveguides 122, 124. The V-grooves extend across the bonding slot 176 and terminate in the alignment slot 174 whose vertical sidewall allows the butt coupling of the output fibers and the stripe waveguides 122, 124. The depth and position of the V-grooves are adjusted to align the core of the output fibers approximately coaxial with the stripe waveguides 122, 124 at the alignment slot 174.

FIG. 6 shows a detailed top view of the coupling region between the stripe waveguide 122 and the V-groove 170. Alignment slot 174 is preferably fabricated with a nearly vertical sidewall 610 in which the waveguide core terminates. A fiber is placed in the V-groove 170, gently pressed against the two angled sides of the V-groove, and gently pressed forward against the sidewall 610. Adhesive is placed in the region 179 (see FIG. 1) and cured, to affix the fibers in position. The bonding slot 176 prevents adhesive from wicking along the fibers or V-groove towards the optical interface at the sidewall 610. The position and angle of the V-groove in the x-z plane, and the depth of the V-groove are preferably set so that the attached fibers are aligned coaxial with the waveguide core 122. The fabrication of V-grooves in silicon, silica, and other substrates is known in the art, as is the slot design and the fiber attachment process, providing multiple alternative realizations.

The electrical connections to the common connection to the back surface of the laser, and for the laser diode stripes, are preferably made via wirebond connections to intermediate electrodes 181, 182, 183, 184, 185 respectively. Connections to the monitor photodiodes 140 and 142 may also be made via wirebonds to connection pads (or electrodes) such as the intermediate electrodes 184, 185 possibly also using an intermediate electrode, such as electrode 181, as a common connection. If common connections are electrically undesirable, as may happen in some electronic circuits sensitive to noise, separate electrodes may be used for each common function. For example, the monitor diodes may have one or even two separate common electrodes (not shown).

FIG. 2 shows a cutaway view of a package arrangement 200 for the hybrid chip assembly 100. The chip assembly 100 is preferably bonded at its lower surface 102 to two thermo electric ("TE") coolers 212 and 214 bonded in series. Two coolers are preferably used to enable a large temperature difference between the chip assembly 100 and the ambient temperature, making possible a wide ambient temperature range over which operation can be obtained while maintaining the chip assembly 100 within its desired narrow temperature range. For broader or narrower operating ranges, more or fewer coolers may be used. If the range of ambient temperature excursion is as small as 5° C. or so, no cooler may be necessary. The TE coolers are in turn bonded to a heat sink 220 shown as part of the package made from one of several appropriate thermally conductive materials including copper, aluminum, KOVAR™, ceramic, etc. This heat sink may have fins or be attached to fins (not shown) for improved heat conduction into the ambient air. Electrical connections 230–233 are shown between the chip and the leads of the package 234 that emerge through the isolating region 236. The connections 230–233 may be directly to electrodes on the chip such as electrodes 164–169, or directly or indirectly (such as via intermediate electrodes 181–185, shown in FIG. 1) to electrode regions on hybrid integrated elements such as the monitor diodes 140 or 142 or the laser diodes 112 and 114. The fibers connected to the chip assembly 100 emerge through the package either via connectors or seals (not shown). The sealing plate 240 may be soldered or welded to the rest of the package if a hermetic seal is desired to exclude humidity for example, or it may sealed with adhesive, or even replaced with a potting material if hermeticity is not required.

The frequency selective feedback structure may alternately be a grating assisted coupler in codirectional coupling or reflective coupling, a bulk-optics grating, a resonator or etalon either in bulk form or in a waveguide (as for instance fabricated by etching two parallel facets or trenches across a waveguide to form a waveguide Fresnel reflector), or other devices capable of selecting a spectrum within the optical frequency range that is then fed back into the amplifier medium by means of optical structures including bulk optics, waveguides, or other integrated optical components. Some of these structures are compatible with a ring laser embodiment including simple rings, multiple rings with interconnections, and more complex topologies in three dimensional waveguide structures.

Tapered Coupling

FIG. 3 shows the preferred embodiment of a hybrid integrated coupling apparatus including a taper, but ignoring other complexities such as the waveguide bends of FIG. 5. A simple taper, described for example in *H G. Unger, U.S. Pat. No. 4,415,227, Nov. 15, 1983, is often insufficient for coupling single mode waveguides with largely different mode dimensions. The normalized propagation constant V of a waveguide helps determine its modal behavior:

$$V = k_0 T \sqrt{(n_f^2 - n_s^2)}, \qquad (8)$$

where $k_0 = 2\pi/\lambda$, T is approximately equal to the smallest transverse dimension of the waveguide, $n_f$ is the index of refraction of the core layer of that waveguide, and $n_s$ is approximately the index of refraction of the underlying layer adjacent to the waveguide. If for example one of the waveguides operates in the middle of the single mode region with a normalized propagation constant V=2.5, a factor of two up-taper will result in multimode behavior. On the other hand, a down taper of such a waveguide is not effective in reducing the mode dimensions. Our problem is to match a small, high-contrast single mode waveguide in a semiconductor diode laser to a larger, low contrast single mode waveguide in a planar waveguide chip. We wish to fabricate the taper on the more easily manufactured passive waveguide substrate. We have designed a three-waveguide approach where we use a third material of index of refraction intermediate between the indices of either the small or the larger waveguides, and we use an extreme taper that drives the third waveguide below cutoff for the operating wavelength.

The cutoff of a waveguide is defined as the parameter value of interest (e.g. wavelength, width, effective index, etc.) past which the transverse confinement of the mode is lost and energy propagates away from the core transverse of the propagation axis of the guide. The cutoff situation is to be distinguished from the coupling between well defined waveguides where energy is exchanged between well defined (otherwise below cutoff) waveguides.

The diode laser chip 310 contains a laser waveguide 320 fabricated on a laser substrate 314. The diode laser chip 310 provides net amplification around a range of wavelengths such as 1552 nm. The diode laser chip 310 has dimensions that are selected according to the wavelength and material system and might be 500 microns thick, 400 microns long in the direction of the waveguide, and 400 microns wide, for a 1550 nm laser. The rear facet 312 forms one end of the laser cavity. The laser lases along the optical axis 324. The other end of the laser cavity may be inside the waveguide 340 at the location of a retroreflecting grating (see grating regions 130, 132 of FIG. 1). The dimensions of the laser waveguide 320 are variable but may typically be about 0.7 microns in the y direction, and about 2.1 microns in the x direction, with an optical mode size of perhaps 0.55 microns and 1.65 microns, respectively. We typically quote the mode size as the $1/e^2$ half width of the intensity. The full width of the mode is about twice the mode size, and the full width at half maximum of the beam is about 1.18 times the mode size. The laser optical axis 324 along the laser waveguide 320 is fixed at a vertical distance 325 above the laser substrate 314, in preparation for bonding and alignment onto the substrate 370.

The laser is preferably attached to the substrate with solder as shown in FIG. 3. The laser lower surface is prepared with an adhesion layer 352, a barrier layer 354, and a cap layer 356. Note that the laser chip is upside-down in FIG. 3 since the substrate 314 is to the top of the figure. The adhesion layer is preferably 0.1 microns of Ti, the barrier layer 0.4 microns of Pt, and the cap layer 0.1 microns of Au. The bonding surface of the substrate 370 may be prepared in a similar way with an adhesion layer 358, a barrier layer 360, and a cap 362. The solder layer 350 is prepared on the cap layer of the substrate for convenience, and may be fabricated from a few microns of AuSn solder with a melting point of about 280° C. The laser waveguide may be aligned in the x-z plane, pressed down into place, and the solder heated for a short time in an appropriate gas such as formic acid to prevent the formation of oxides and to allow the laser chip to bond. Notice that the thicknesses of the solder layer 350 and the other layers are controlled so that the laser substrate 314 after bonding has a desired vertical separation 326 from the bonding surface 371 of the substrate 370, within a tolerance for good optical coupling. Since the laser waveguide 320 lies a fixed distance above the laser substrate 314 according to the process sequence in the fabrication of the laser, and the tapered waveguide 330 lies a fixed distance 335 above the bonding surface 371 of the substrate 370 according to the process sequence in the fabrication of the tapered waveguide 330, it follows that by controlling the bonding layers 350, 352, 354, 356, 358, 360, and 362 and the bonding process, we can adjust and control the relative vertical positions of the laser waveguide 320 and the tapered waveguide 330 by adjusting and controlling the separation between the two substrates 314 and 370. Within the vertical tolerance, the vertical separation 326 may be adjusted to equal the sum of the vertical height 325 of the laser waveguide 320 and the vertical height 335 of the tapered waveguide 330.

The waveguide 340 fabricated has dimensions chosen to optimize other factors including the efficiency of coupling to standard optical fiber, the fraction of the mode that propagates in the cladding, and the propagation loss through structures including bends. While again the dimensions of this waveguide may vary by a factor of three to ten or so, depending on these factors and fabrication factors such as index difference, we have chosen commercial silica technology for waveguide 340 with a preference for a waveguide dimension of 2 microns by 2 microns with a 2% index difference core-to-clad.

The disparity in the dimensions of the laser waveguide 320 and the waveguide 340 would result in a high coupling loss if the laser waveguide 320 were to be butt coupled directly to the waveguide 340 (close to 4 dB), even with perfect alignment. In the hybrid grating laser, this loss is intracavity and will increase the threshold and reduce the output power. The tapered waveguide 330 is preferably provided to improve the coupling efficiency to better than 3 dB and preferably less than 1 dB or even 0.5 dB. The tapered waveguide 330 is preferably butt coupled to the laser waveguide 320, and parallel-coupled to the waveguide 340 with a special taper that drops the effective index of the tapered waveguide 330 below cutoff. Ideally, the input end 332 of the tapered waveguide 330 is designed so that the transverse dimensions of the lowest order optical mode propagating in the input segment of the tapered waveguide 330 are equal to or near the transverse dimensions of the lowest order optical mode emerging from the diode laser waveguide 320. By providing an index matching material in the gap between the two waveguides, the Fresnel reflections and optical scatter from the two waveguide ends can also be minimized. FIG. 3 shows that the tapered waveguide 330 is preferably fabricated directly on top of the waveguide 340, but in an alternate design may be below it or separated by additional layers.

The tapered portion of the tapered waveguide 330 brings the propagation constant of the tapered waveguide 330 close to that of the waveguide 340 allowing energy to couple between the waveguides. The taper continues until the tapered waveguide 330 goes below cutoff. Light propagating out of the laser waveguide 320 is butt coupled into the end of the tapered waveguide 330; in the down-tapered region it is in turn transversely coupled into the parallel waveguide 340. Light returning from the opposite direction in waveguide 340 is transversely coupled into the same portion of the tapered waveguide 330 which is now up-tapered for light propagating towards the laser, whereupon it is butt coupled into the laser waveguide 320 of the diode laser chip. The waveguide 340 is fabricated from a material with index of refraction $n_2$. The surrounding materials have lower indices close to and possibly identical to that of silica $n_1$. The strength $\Delta$ of the waveguide 340 depends on the local transverse dimensions, the index of the cladding 342 if different from that of silica, and the index difference $$\Delta_{340}=(n_2-n_1)/n_1. \quad (9)$$

Depending on these parameters, the waveguide 340 will guide a lowest order optical mode that has an effective index of refraction $n_{eff}$ that lies approximately in the range $n_1<n_{eff}<n_2$.

FIG. 4 illustrates the changes in index of refraction produced by the operation of the taper. For the tapered waveguide 330 to function, its index of refraction $n_3$ is larger than $n_2$. As shown in the region 460 in FIG. 4, the $n_{eff}$ 430 of the first segment of the tapered waveguide 330 is larger than the $n_{eff}$ 440 of the first segment of the waveguide. A taper reduces the strength of the waveguide over the region 470, lowering the $n_{eff}$ 430 and changing the mode shape. The taper can be accomplished by varying the local transverse dimensions and the index difference, but it is easier to vary the lateral width of the waveguide by changing the mask used to determine the waveguide pattern during fabrication. While the tapered waveguide 330 is still relatively strong, the taper can be rapid, as shown in the region along the z axis of extent $T_1$ in FIGS. 3 and 4. However, as the taper progresses, the mode of the tapered waveguide 330 begins to couple with the modes of the waveguide 340 in the coupling region 450.

Coupling will be strongest with the lowest order mode of the waveguide 340 because their effective indices are closest. Energy exchange occurs over the coupling region 450, which is a limited region in z where the two mode indices approach each other, and where the respective indices acquire an imaginary part. Looking at the propagation direction of increasing z, as the taper progresses, the two modes perturb each other more strongly, and the coupling becomes stronger. Eventually the mode of the tapered waveguide 330 disappears (below cutoff), the imaginary part of the index returns to zero, energy exchange ceases, and the perturbation of the lowest order mode of the waveguide 340 disappears. To accomplish an efficient transfer of energy from the tapered waveguide 330 into the waveguide 340, it is desirable to accomplish the taper slowly while the modes couple, allowing sufficient interaction time for completion of energy exchange. The region $T_2$ is typically longer than the region $T_1$ for this reason.

There are many choices to be made in selecting a particular waveguide and taper design. Materials for the upper and lower waveguides are preferably stable, easily processable, and compatible. Even within a given choice of materials set, there remain many options and several degrees of freedom. The preferred taper design for this application uses a silica ($SiO_2$) materials system for the waveguide 340 and lower cladding 344, and a tantala ($Ta_2O_5$) core for the tapered waveguide 330, with a polymer top cladding 342.

For the tapered waveguide 330, which is the "upper" waveguide in this example, we choose tantala because of its stability, low loss, and high index $n_3=2.03$ at 1.55 microns. Note that the exact index of refraction depends on the process used to deposit the film. Since the taper characteristics depend sensitively on the index, all of the numbers quoted here are calculated for $n_3=2.03$, but are preferably adjusted experimentally to obtain the desired performance for a given manufacturing process. The vertical dimension of the input end 332 of the tapered waveguide 330 is preferably chosen to be about 0.08 micron (in the y dimension), producing a very weak vertical guide with a vertical mode size of about 0.8 microns that approximately matches the vertical dimension of the guided mode in the diode laser. The lateral dimension is preferably about 2 microns (in the x direction), producing a lateral mode size of about 1.3 microns, close enough to the diode laser mode size of about 1.65 microns. The effective index of this guide is preferably just slightly above cutoff, at approximately $n_{eff}=1.49$, so that the mode fill width is substantially larger than the core dimensions, particularly in the vertical direction. The length of the initial taper maybe short, in the region of $T_1=100$ microns or so, and the majority of the taper may be accomplished here, reducing the width of the waveguide by a factor that may be 2 or even 10 or more, depending on the specific design. The exact length and amount of taper in this region can be adjusted experimentally to optimize the amount of mode size reduction while minimizing the optical loss (the length $T_1$ can be increased to reduce the optical loss). Most of the taper but essentially no coupling is preferably accomplished in this rapid taper section. The second taper may be longer such as $T_2=500$ microns or so, and sufficient taper is provided to initiate the coupling between the modes, to carry the upper waveguide mode below cutoff, and to decouple and substantially reduce the perturbation of the lower waveguide. It may be sufficient to taper this portion of the guide by 50%. Again, the exact length and amount of taper in this region may be adjusted experimentally to optimize the amount of energy transfer between modes (the length $T_2$ can be increased to reduce the optical loss). The initial untapered portion may be very short or even of zero length, or multiple tapered sections may be provided.

The preferred taper design uses a 0.08 micron tantala thickness and a single taper (i.e. $T_1=0$) in which the lateral waveguide width is tapered down from 2 microns to 0.7 microns over a distance $T_2=600$ microns. As the mask width becomes smaller than about 1 micron, factors such as lithographic resolution and mask undercutting make it increasingly difficult to reproduce small features. Although the mask provides taper in the lateral dimension, the process of reproducing the mask and defining the waveguide width will provide both somewhat narrower lateral features than 0.7 microns, and a natural vertical taper that is more pronounced at the small end of the tapered waveguide 330. For this reason, the effects of the fabrication equipment on the function of the taper should preferably be taken into account, and the dimensions adjusted accordingly. Indeed, this fact may be made use of in the design to realize a lower effective index at the thin end of the waveguide than is called for in the mask design. At the end of the taper, the tapered waveguide 330 may be terminated abruptly because the tapered waveguide 330 is below cutoff and very little optical energy remains in the region of the core. Alternatively, the mask taper may be continued to zero width, allowing the lithographic process to terminate the waveguide naturally.

FIG. 8 shows an alternative taper design in which segmentation is included in the design of the waveguide. A substrate 870 is prepared with a waveguide core 840 of index $n_2$, upper cladding 842 of index approximately $n_1$, and lower cladding 844 of index $n_1$. The waveguide core 840 has higher index of refraction than the cladding layers so that it guides at least one optical mode. Segmented waveguide 830 is fabricated on the waveguide core 840 with a layer of a desired thickness and index $n_3$, it is patterned by removing undesired material into a tapered width that is preferably wider laterally at the interface 832, and into a segmented pattern by removing material in the regions 838. The removal of material is shown as complete, but the removal may extend down to some degree into the core material of the waveguide core 840, or the removal maybe incomplete, leaving some material behind, bridging the segments 836 (not shown). Notice that the optical propagation axis 834 is a determined distance 835 above the substrate 870, in preparation for a second chip to be attached on the empty portion 872 of the substrate as discussed elsewhere and in relation to FIG. 3. As a variation, the waveguide core may be fabricated on the segmented waveguide, in which case, the segments will be embedded into the material of the waveguide core instead of into the cladding material. The device 800 may be a portion of the devices 300 or 100 illustrated in FIGS. 3 and 1, respectively, or other devices.

As shown, in FIG, 8, the high-index segmented waveguide 830 is fabricated from segments 836 that are interspersed with adjacent regions 838 (segments) where the high index material has been removed. Provided that the segmentation period (the sum of the widths of a segment and an adjacent region along the direction of optical propagation) is comparable or less than the vertical and lateral Rayleigh ranges $$z_0 = \pi W_0^2 / \lambda \tag{10}$$

where $z_0$ is the Rayleigh range, $w_0$ is the $1/e^2$ optical beam intensity half width, and $\lambda$ is the vacuum optical wavelength of the mode, the optical mode will propagate as if the waveguide core were continuous (non-segmented) but had a lower index than that of the segments 836. The effective index contrast with the cladding 842 is reduced by the local duty factor $$DF_{seg} = \text{(local length of segment)/(local segmentation period)} \tag{11}$$

of the segmentation. A duty factor of 50%, obtained when the segments and the removed regions are of equal length, will reduce the effective index of the waveguide by a factor of approximately two. By adjusting the parameters of the waveguide appropriately, the desired mode sizes can be obtained with a segmented guide, but additional degrees of freedom are now available to the designer: the duty factor and the period of the segmentation. For example, if the duty factor is 50% in the region near the input of the waveguide, and the thickness of the tantala film used to fabricate the segments 836 is increased by a factor of 1.414 compared to the previous description to 0.11 microns, the waveguide strength and mode sizes in the vertical and transverse dimensions will be approximately the same as described above.

The duty factor may be reduced along the propagation axis 834 of the segmented waveguide 830 by changing the lithographic mask pattern used in fabricating the segmented waveguide 830, aiding in the accomplishment of the taper. The taper required for the non-segmented waveguide described above has a waveguide width at the small end of the waveguide of 0.7 microns. Such a small dimension may be a challenge to fabricate reproducibly. Larger minimum dimensions are preferred. With the use of segmentation, we choose a minimum dimension of 1.0 micron to obtain the same optical effect of the taper, in terms of the variation of the effective index of the optical mode. The segmented waveguide 830 now tapers laterally from a 2 micron width to a 1 micron width at the small end, the length of the segments 836 is kept constant at 1 micron, and the duty factor is varied from 50% to 25% by increasing the length of the adjacent regions 838 gradually from 1 micron to 4 microns at the small end. Many variations of the functional form of the taper of the segmentation are possible, and many others can be useful, including a linear taper of the duty factor, exponential, hyperbolic, sinusoidal, and all the other mathematical forms. The general segmentation taper includes the possibility of a taper in the period with alternative functional forms, provided that the period continues to obey the constraint of being comparable or less than the Rayleigh ranges. Many variations are also available in the geometry of segmentation, such as the indented geometry of R. Adar, U.S. Pat. No. 5,577,141, Nov. 19, 1996, "Two-dimensional segmentation mode tapering for integrated optic waveguides", multiple superposed layers of variously segmented materials, etc.

The tantala waveguides shown in FIGS. 1, 3, 5, and 8 are preferably fabricated by deposition of a tantala film of the desired thickness after the fabrication of the germania/silica core. The tantala film may then be patterned by RIE after a masking step to define the desired boundaries of the tantala waveguide segments. Several variations are available, but not shown in the figures, including depositing the tantala waveguide after the top cladding has been deposited. In the latter case, the top cladding is patterned and removed down close to the top surface of the germania/silica core wherever the tantala waveguide structure is desired; a uniform deposition of the desired thickness of tantala is then sufficient to create the desired waveguide.

Lensed Waveguide End

FIGS. 7A and 7B show an alternative preferred taper embodiment that can provide good coupling efficiency between two dissimilar waveguides. This approach is based on lensing the waveguide end. FIG. 7A shows a substrate 770 prepared with a waveguide core 740 upper cladding 742 and lower cladding 744. The waveguide core 740 has higher index of refraction than the cladding layers so that it guides at least one optical mode. As with the waveguides described elsewhere herein, this waveguide may be called a single mode waveguide if it guides predominantly a single mode. The higher order modes may be cut off, in which case the guide is strictly single mode, or a few poorly confined and higher loss modes may be weakly guided, in which case the guide is effectively single mode which may still be useful for many applications including coupling to single mode optical fibers. A region 752 of the waveguide core 740 projects slightly from the surface 732. Although the projection is shown with sharp edges in FIG. 7A, these edges may be rounded.

This projection may be fabricated by applying a two-step selective etch. First, the waveguide may be etched vertically by a non selective etching process that etches both the cladding and core layers at similar rates, exposing upper and lower cladding in the region where the waveguide core 740 emerges at the surface. In this step an etch barrier such as a metal coating of Au or Cr is deposited onto the surface of the semi-processed article. A patterned layer of photo resist is applied on top of the etch barrier in the desired pattern of the removal region (and other patterns if desired) and etched to transfer the photo resist pattern to the etch barrier. A reactive ion etching process may be used to etch down into the silica layers left exposed by the patterned etch barrier layer. The etch time is preferably controlled to allow an etch depth large enough to etch through the waveguide core 740 and into the lower cladding 744. The etch proceeds approximately vertically down towards the substrate 770. Many process alternatives exist to accomplish this etch; the preferred method is to use $CHF_3$ as the reactive gas at a pressure of 20 m Torr. At this stage, the exposed surface of the semi-processed device is flat.

Second, a selective etch may be performed on the surface, that preferentially etches the upper cladding 742 and the lower cladding 744 compared to the waveguide core 740. The preferred way to perform this etch is to perform a chemical etch with a buffered HF solution (BHF: a mixture of ammonium fluoride and hydrofluoric acid). As is known in the art, BHF etches silica rapidly, but does not etch $GeO_2$ at all, so that the $GeO_2$-rich core layer etches more slowly than the pure silica cladding layers. The exact profile of the protrusion created by this process follows the concentration profile of Ge. Other means of selective etching may also be used, including dry etching. The distance by which the center of the core projects from the surface 732 depends on the etching parameters (materials, densities, time, temperature, etc.). If there is no upper cladding used for the waveguide core 740, i.e. upper cladding 742 is absent (not shown), the shape of the resultant lenticular structure will be different, and asymmetric vertically. As was the case for FIG. 3, a diode laser chip may be aligned and attached to the substrate 770 (preferably by flip-chip bonding) so that the axis of the laser waveguide is coaxial with the axis 754 of the waveguide core 740. Although for simplicity FIG. 7A shows the core shape being unchanged by the etching process, in reality, the shape of the protrusion 753 in the region of the waveguide core 740 at the surface 732 has no sharp corners and can be described by smooth curves as in FIG. 7B, where surface grid lines along the x-z planes and the y-z planes are shown to give an impression of the smoothly varying surface shape. FIG. 7B shows the protrusion 753 forming a lenticular structure with two different curvatures in the x-z and in the y-z planes, since the height (y-dimension) and width (x-dimension) of the waveguide core 740 at the surface 732 are different. Different curvatures are desired because the divergences of the diode laser mode are quite different in the two planes due to the different typical mode sizes, as described above. The small vertical mode size leads to strong vertical divergence, so a strong curvature is desired in the y-z plane. Only a weak (or no) horizontal curvature is needed to compensate the horizontal beam divergence. To accommodate this difference, the approximately square cross-section waveguide core 740 may be widened as shown in the rectangular regions 750 for FIG. 7A and 751 for FIG. 7B. The curvature in the y-z plane may be adjusted through the selective etching conditions, with generally larger etching time producing a larger curvature, all other things being equal. The curvature is preferably adjusted until the vertical divergence of the diode laser beam may be compensated. The curvatures of the protrusion 753 will vary inversely as the widths of the waveguide in the surface 732, so the desired ratio of curvatures (vertical to horizontal) can be obtained by adjusting the ratio of the widths (vertical to horizontal). Since a hyperbolic lens surface has no spherical aberration, the fabrication conditions are preferably adjusted to obtain a near-hyperbolic profile for the protrusion 753 in the region near the axis 754 where the mode profile crosses the surface 732.

In the case of a planar waveguide, the waveguide core 740 is very wide laterally compared to its vertical width, it supports a plurality of different axes of propagation in the x-z plane, and the lenticular structure will be translationally invariant along the x axis, providing focusing mainly in the vertical y-z plane. Note also that the surface 732 (ignoring the protrusion) is shown as being locally normal to the axis of propagation 754 of the mode of the waveguide core 740. In this case, by the symmetry of the situation, the local surface of the protrusion at the axis 754 is normal to that axis. However, this surface may be inclined at an angle to deviate the beam, or curved to provide lateral focusing, or take on another shape for a different purpose.

In FIG. 7A, the rectangular portion 750 (compare 751 of FIG. 7B) of the waveguide is preferably kept smaller in length (along the direction of propagation) than the lateral Rayleigh range so that the optical mode does not have a significant opportunity to expand in the horizontal dimension between the surface 732 and the beginning of the roughly square region 760 of the waveguide 740. If this condition is obeyed, no taper may be needed between the rectangular portion 750 and the square region 760. In use of a lensed waveguide coupling section, it may be desirable not to use index matching material. Use of an index matching material has the advantage of reducing the Fresnel reflections, but it has the undesired effect of requiring an increased curvature of the surface 732, which undesirably increases the fabrication time and tightens the manufacturing tolerances.

In an optional step of the fabrication of the lensed surface 753, the region may be heated to a temperature near the softening temperature of the materials. Above the softening temperature but below the melting point, the surface tension of the silica can change the surface profile. This can be called thermal slumping of the surface. By applying a controlled thermal ramp to the wafer, or to an individual part, the temperature may be raised above the softening temperature for a time sufficient to allow a reduction in the curvature of the protrusion to a desired value. This step is of interest if the spatial profile of the protrusion produced by the selective etch step described above is too sharp (as shown in FIG. 7A). Another desirable effect of thermal slumping is the smoothing of the surface, reducing optical scatter. The heating may be accomplished of a single chip, the entire wafer, or of individually selected regions. While an oven can be used for wafer-scale processing, a laser can advantageously be used to heat the region around the protrusion 752 or lensed surface 753 if it is desired to slump individual regions. Preferably, a $CO_2$ laser may be used to provide an energetic pulse of 10 micron optical radiation that is directed onto the surface 732 and is partly absorbed in a volume near the surface. If an optical pulse is applied so that between about 0.5 to 1 J/cm$^2$ is absorbed within the top few microns of the predominantly silica waveguide material during a period of a few microseconds, thermal slumping will be observed. For longer pulses, more energy will be required, but the thermal diffusion depth varies approximately as the square root of the time, so the required energy increases as the square root of the pulse length above a pulse duration of a few microseconds. By controlling the laser pulse length and energy, (and wavelength), and the number of pulses, the desired degree of slumping can be controlled to approach the desired curvature.

The lensed surface 753 may be used to refocus optical radiation. An optical beam is propagated along the waveguide 740 towards the lensed surface 753. Provided that the material outside the waveguide and across the interface with the surface 732 has a lower index of refraction than the waveguide core 740, upon traversing the interface with the surface 732, the beam is focussed by the curvature of the surface 732, and acquires a converging characteristic. The higher-index central portion of the protrusion retards the phase fronts of the mode as it traverses the interface, causing phase front curvature related to the curvature of the protrusion, and focussing the mode. As the beam continues to propagate towards a longitudinal position of minimum beam size, at least one beam dimension continues to shrink or focus. Another waveguide may be aligned in proximity to this position so that the refocussed beam can enter the second waveguide with good coupling efficiency. If the second waveguide is the active waveguide of a semiconductor laser, the arrangement described may be a part of an injection locking apparatus, an external cavity resonator apparatus, an amplifier apparatus, or other structures.

Alternatively, the lensed surface 753 may be used in effectively coupling a second waveguide such as in a semiconductor laser to a waveguide core 740. In this case, the optical beam is originated inside the diode laser, propagates to the protrusion where it is refocussed from a diverging beam, and propagates along the axis 754 of the waveguide core 740. Again the end of the second waveguide may be aligned relative to the surface 732 such that the emission facet is co-located with the minimum focus, within a tolerance to achieve the desired coupling efficiency. If the second waveguide is fabricated on the same substrate as the waveguide core 740, the alignment of the end of the second waveguide is accomplished lithographically. If the second waveguide is a semiconductor diode laser, the alignment of the second waveguide end is accomplished during an attach process between the substrate of the diode laser and the substrate 770.

In a further alternative preferred embodiment, an indentation may be fabricated instead of a protrusion. To fabricate the indentation, a selective etch process may be performed that preferentially etches the material of the waveguide core 740 compared to the upper cladding 742 and the lower cladding 744. The preferred way to perform this etch is to perform a chemical etch with an aqueous solution of $H_2SO_4$. Since the etching rate of $SiO_2$ in this etchant is nil, while the etching rate of $GeO_2$ is medium, a process temperature above room temperature is preferred, such as 30° C. or 5° C. The $GeO_2$-rich core layer 740 etches more rapidly than the pure silica cladding layers. Again, the profile of the indentation created by this process follows the concentration profile of Ge. Now, with air in the removal region, the indentation defocusses the mode passing through the interface, which may be useful for some applications. With an index matching fluid in the removal region that has a higher index of refraction than the waveguide core 740, focusing is again obtained at the indentation. The general description of the structures incorporating the protrusion and the usage of the protrusion also apply to the indentation provided that attention is paid to the reversal of the focusing properties according to the index of refraction of the removal region.

The invention has now been explained with reference to specific embodiments. In order to avoid unnecessary repetition, it is intended that the variations described in respect of one figure above may also apply to the other figures, either singly or in combination. Other embodiments will be apparent to those of ordinary skill in the art. Therefore, it is not intended that the invention be limited, except as indicated by the appended claims, which form a part of this invention description.

What is claimed is:

1. An optical device comprising:
   a thin-film waveguide segment fabricated on a substrate, the thin-film waveguide segment having a core structure of a core material having a first index of refraction and a cladding structure, the cladding structure at least partially surrounding the core structure and having a second index of refraction lower than the first index for guiding an optical mode along an optical propagation axis,
   a surface of the cladding structure, the optical propagation axis intersecting the surface of the cladding structure, and
   a lenticular protrusion formed from the core material and extending from the surface of the cladding structure, the lenticular protrusion being optically coupled to the core structure for refracting the optical mode along a focal axis.

2. The optical device of claim 1 wherein the cladding structure comprises a first cladding layer, the core structure being formed on the first cladding layer, and a second cladding region, the second cladding region being formed around a remaining portion of the core structure.

3. The optical device of claim 2 wherein the first cladding layer is the substrate.

4. The optical device of claim 1 wherein the core structure and the cladding structure form a single-mode waveguide.

5. The optical device of claim 1 wherein the surface of the cladding structure in a region surrounding the core structure is essentially planar and essentially orthogonal to the optical propagation axis.

6. The optical device of claim 1 further comprising a layer of optically transparent material disposed on and covering the lenticular protrusion, the optically transparent material having a third index of refraction less than the first index of refraction.

7. The optical device of claim 6 wherein the layer of optically transparent material is part of a second cladding region, the second cladding region being formed around a remaining portion of the core structure.

8. The optical device of claim 1 further comprising a layer of optically transparent material disposed on and covering the lenticular protrusion, the optically transparent material having a third index of refraction greater than the first index of refraction.

9. The optical device of claim 1 wherein the lenticular protrusion has a first radius of curvature along a first plane and a second radius of curvature along a second plane, the first plane and the second plane both being essentially orthogonal to the optical propagation axis.

10. The optical device of claim 9 wherein at least a portion of the core structure has a cross-section that is essentially rectangular with a long axis and a short axis, wherein the first radius of curvature rotates about the long axis and is less than the second radius of curvature that rotates about the short axis.

11. The optical device of claim 10 wherein the short axis of the cross-section is chosen according to a desired first radius of curvature.

12. The optical device of claim 1 wherein the lenticular protrusion has a lenticular surface defined by a non-uniform radius of curvature.

13. The optical device of claim 1 wherein the core structure has a first region with a first cross-section area and a second region with a second cross-section area, the first cross-section area being greater than the second cross-section area, the lenticular protrusion being formed from and coupled to the first region.

14. The optical device of claim 13 wherein the first region has an essentially rectangular cross-section and the second region has an essentially square cross section.

15. The optical device of claim 14 wherein the first region and the second region are formed from a common layer of core material with an essentially constant thickness.

16. The optical device of claim 1 wherein the core material comprises a Ge-doped silica material and the cladding structure comprises silica, the first index of refraction being greater than an index of refraction of the cladding material by at least about 2%.

17. An optical device comprising:
    a thin-film waveguide segment fabricated on a substrate, the thin-film waveguide segment having a core structure of a core material having a first index of refraction and a cladding structure, the cladding structure at least partially surrounding the core structure and having a second index of refraction lower than the first index for guiding an optical mode along an optical propagation axis,
    a surface of the cladding structure, the optical propagation axis intersecting the surface of the cladding structure, and
    a lenticular indentation formed in the core material and extending from the surface of the cladding structure, the lenticular indentation being optically coupled to the core structure for refracting the optical mode along a focal axis.

18. An optical device comprising:
    a thin-film waveguide segment fabricated on a silicon substrate, the thin-film waveguide segment having a core structure of Ge-doped silica having a first index of refraction, the core structure being disposed on a first layer of a silica material,
    a second layer of a silica material disposed on a portion of the first layer and on the core structure to form a cladding structure surrounding the core structure, the cladding structure having a second index of refraction lower than the first index for guiding an optical mode along an optical propagation axis, the core structure having a rectangular cross-section essentially orthogonal to the optical propagation axis
    a surface of the cladding structure, the optical propagation axis intersecting the surface of the cladding structure, and
    a lenticular protrusion formed from the Ge-doped silica extending from the surface of the cladding structure, the lenticular protrusion being optically coupled to the core structure for refracting the optical mode along a focal axis, and having a first radius of curvature about a first axis of the rectangular cross section and a second radius of curvature about a second axis of the rectangular cross section, the first axis being essentially perpendicular to the second axis.

19. A hybrid integrated optical device comprising:
    a first chip with a first waveguide segment and a first waveguide end, the first chip being mounted on a substrate; and
    a optical chip with a second waveguide segment, the second waveguide segment including a thin-film waveguide core portion of a first material having a first index of refraction and a waveguide cladding portion of a second material having a second index of refraction, the first index of refraction being greater than the second index of refraction for guiding an optical mode along a propagation axis, the second waveguide segment having a lenticular core end, the lenticular core end being formed substantially from the core material, the first chip being disposed in relation to the second chip to optically couple the first waveguide end to the lenticular core end.

20. The device of claim 19 wherein the lenticular core end includes a convex surface.

21. The device of claim 19 wherein the lenticular core end includes a concave surface.

22. The device of claim 19 wherein the second chip comprises the substrate upon which the first chip is mounted.

23. The device of claim 19 wherein the first material comprises Ge-doped silica.

24. A hybrid integrated optical device comprising:
   a first optical element with a first waveguide segment and a first waveguide end; and
   an optical chip with a second waveguide segment, the second waveguide segment including a thin-film waveguide core portion of a first material having a first index of refraction and a waveguide cladding portion of a second material having a second index of refraction, the first index of refraction being greater than the second index of refraction for guiding an optical mode along a propagation axis, the second waveguide segment having a lenticular core end, the lenticular core end being formed substantially from the core material, the first element being disposed in relation to the chip to optically couple the first waveguide end to the lenticular core end.

25. A method of fabricating an optical device with an integrated lens on an end of a thin-film waveguide, the method comprising:
   forming a layer of core material on a major surface of a substrate;
   patterning the layer of core material to form a waveguide core structure having an optical propagation axis;
   defining an essentially planar first coupling surface extending through the core material, the coupling surface being essentially orthogonal to the major surface of the substrate, the optical propagation axis intersecting the coupling surface; and
   exposing a protrusion region of the core material extending from a second coupling surface, the second coupling surface being essentially parallel to the first coupling surface.

26. The method of claim 25 wherein the exposing a protrusion region step comprises an etching step.

27. The method of claim 26 wherein the etching step comprises a wet etching step.

28. The method of claim 25 wherein the step of exposing a protrusion region comprises a step of forming a lenticular portion of the waveguide core structure.

29. The method of claim 25 further comprising a step of:
   forming a lenticular portion of the waveguide core structure from the protrusion region of the core material.

30. The method of claim 29 wherein the forming a lenticular portion step comprises a thermal impulse step.

31. The method of claim 30 wherein the thermal impulse step comprises a rapid thermal pulse.

32. The method of claim 30 wherein the thermal impulse step comprises a laser pulse.

33. The method of claim 30 wherein the thermal impulse step heats the protrusion region for a selected period of time to a softening point of the core material to achieve a thermal slumping of the protrusion region into the lenticular portion.

34. The method of claim 25 wherein the core material comprises a silica-based material.

35. The method of claim 25 wherein the first coupling surface is essentially orthogonal to the optical propagation axis.

36. The method of claim 25 further comprising steps, after the patterning the layer of core material step, of
   forming a sacrificial cladding around the waveguide core structure; and, after the forming a lenticular portion step, of
   removing the sacrificial cladding, wherein
   the exposing a protrusion region step comprises removing a portion of the sacrificial cladding proximate to the first coupling surface.

37. The method of claim 25 further comprising a step, after the patterning of the layer of core material step, of
   forming cladding material around the waveguide core structure, wherein
   the first coupling surface extends through the cladding material and the core material, the defining an essentially planar first coupling surface step comprising an etch process, and wherein
   the exposing a protrusion region step comprises a preferential etch step in which the cladding material is selectively etched more rapidly than the core material.

38. The method of claim 37 in which the core material comprises Ge-doped silica and the cladding material comprises non-Ge-doped silica.

39. The method of claim 37 further comprising a step, prior to the forming a layer of core material, of
   forming a first layer of first cladding material on the substrate.

40. The method of claim 39 wherein the substrate is a silicon substrate and the first layer of cladding material comprises silica.

41. A method of fabricating an optical device with an integrated lens on an end of a thin-film waveguide, the method comprising:
   forming a first layer of silicon-oxide cladding material on a major surface of a silicon substrate;
   forming a layer of Ge-doped silica core material on the layer of silicon-oxide cladding material;
   patterning the layer of core material to form a waveguide core structure having an optical propagation axis;
   forming a second layer of silicon-oxide cladding material to clad a remaining portion of the waveguide core structure
   defining an essentially planar first coupling surface extending through the core material, the second layer of cladding material, and at least a portion of the first layer of cladding material, the coupling surface being essentially orthogonal to the major surface of the substrate, the optical propagation axis intersecting the coupling surface; and
   preferentially etching the first coupling surface to expose a portion of the core material extending from a second coupling surface, the second coupling surface being defined in the second layer of cladding material and the portion of the first layer of cladding material, and being essentially parallel to the first coupling surface.

42. The method of claim 41 further comprising the step of:

applying a selected amount of thermal energy to at least the exposed portion of the core material extending from the second coupling surface for a selected period of time to form a lenticular portion on an end of the waveguide core structure.

43. A method of fabricating an optical device with a thin-film waveguide having a concave lenticular end, the method comprising steps of:

forming a first layer of cladding material on a major surface of a substrate;

forming a layer of core material on the layer of cladding material;

patterning the layer of core material to form a waveguide core structure having an optical propagation axis;

forming a second layer of cladding material to clad a remaining portion of the waveguide core structure;

defining an essentially planar coupling surface orthogonal to the major surface of the substrate, the coupling surface extending through the second layer of cladding material, the waveguide core structure, and at least a portion of the first layer of cladding material; and selectively etching the core material exposed at the coupling surface to form a concave surface on an end of the waveguide core material.

* * * * *